(12) United States Patent
Akimoto

(10) Patent No.: US 8,759,842 B2
(45) Date of Patent: Jun. 24, 2014

(54) SEMICONDUCTOR DEVICE AND METHOD FOR MANUFACTURING THE SAME

(75) Inventor: Kengo Akimoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 421 days.

(21) Appl. No.: 13/154,803

(22) Filed: Jun. 7, 2011

(65) Prior Publication Data

US 2011/0233595 A1 Sep. 29, 2011

Related U.S. Application Data

(62) Division of application No. 12/135,344, filed on Jun. 9, 2008, now Pat. No. 7,964,423.

(30) Foreign Application Priority Data

Jun. 14, 2007 (JP) .................................. 2007-157063

(51) Int. Cl.
*H01L 33/62* (2010.01)
(52) U.S. Cl.
USPC ............... 257/81; 257/99; 257/749; 257/773; 257/E33.065
(58) Field of Classification Search
USPC ........................ 257/81, 99, 749, 773, E33.065
See application file for complete search history.

(56) References Cited

U.S. PATENT DOCUMENTS

| | | | |
|---|---|---|---|
| 5,137,461 A | 8/1992 | Bindra | |
| 5,557,121 A * | 9/1996 | Kozuka et al. | ................. 257/292 |
| 6,335,231 B1 | 1/2002 | Yamazaki et al. | |
| 6,803,264 B2 | 10/2004 | Yamazaki et al. | |
| 6,905,907 B2 | 6/2005 | Konuma | |
| 6,953,735 B2 | 10/2005 | Yamazaki et al. | |
| 7,145,536 B1 | 12/2006 | Yamazaki et al. | |
| 7,273,773 B2 | 9/2007 | Yamazaki et al. | |
| 7,411,215 B2 * | 8/2008 | Hayakawa et al. | ............. 257/72 |
| 7,473,592 B2 | 1/2009 | Yamazaki et al. | |

(Continued)

FOREIGN PATENT DOCUMENTS

| | | |
|---|---|---|
| EP | 1517363 A2 | 3/2005 |
| JP | 11-163363 A | 6/1999 |

(Continued)

*Primary Examiner* — George Fourson, III
(74) *Attorney, Agent, or Firm* — Fish & Richardson P.C.

(57) ABSTRACT

The invention relates to a semiconductor device and a method for manufacturing the semiconductor device, which includes: an insulating film over a substrate; a first pixel electrode embedded in the insulating film; an island-shaped single-crystal semiconductor layer over the insulating film; a gate insulating film and a gate electrode; an interlayer insulating film which covers the island-shaped single-crystal semiconductor layer and the gate electrode; a wiring which electrically connects a high-concentration impurity region and the first pixel electrode to each other; a partition which covers the interlayer insulating film, the island-shaped single-crystal semiconductor layer, and the gate electrode and has an opening in a region over the first pixel electrode; a light-emitting layer formed in a region which is over the pixel electrode and surrounded by the partition; and a second pixel electrode electrically connected to the light-emitting layer. A surface of the first pixel electrode, which is in contact with the light-emitting layer, is flat, and a surface where the insulating film is in contact with the island-shaped single-crystal semiconductor layer roughly coincides with a surface where the first pixel electrode is in contact with the light-emitting layer.

20 Claims, 17 Drawing Sheets

(56) References Cited

U.S. PATENT DOCUMENTS

| | | | |
|---|---|---|---|
| 7,473,971 B2 | 1/2009 | Yamazaki et al. | |
| 7,476,576 B2 | 1/2009 | Yamazaki et al. | |
| 7,488,980 B2* | 2/2009 | Takafuji et al. | 257/64 |
| 7,638,805 B2 | 12/2009 | Yamazaki et al. | |
| 7,642,598 B2 | 1/2010 | Yamazaki et al. | |
| 7,695,996 B2 | 4/2010 | Dupont et al. | |
| RE42,097 E | 2/2011 | Yamazaki et al. | |
| RE42,139 E | 2/2011 | Yamazaki et al. | |
| RE42,241 E | 3/2011 | Yamazaki et al. | |
| 7,939,888 B2 | 5/2011 | Yamazaki et al. | |
| 7,964,423 B2* | 6/2011 | Akimoto | 438/39 |
| 8,114,722 B2 | 2/2012 | Kakehata | |
| 8,115,788 B2 | 2/2012 | Kimura | |
| 8,284,369 B2* | 10/2012 | Chida et al. | 349/149 |
| 2005/0266591 A1 | 12/2005 | Hideo | |
| 2007/0287209 A1 | 12/2007 | Fujii | |
| 2008/0012076 A1* | 1/2008 | Yamazaki et al. | 257/347 |
| 2008/0054269 A1 | 3/2008 | Yamazaki et al. | |
| 2008/0070335 A1 | 3/2008 | Yamazaki et al. | |
| 2008/0293237 A1* | 11/2008 | Terasaki et al. | 438/618 |
| 2009/0001469 A1 | 1/2009 | Yoshida et al. | |
| 2009/0051046 A1 | 2/2009 | Yamazaki et al. | |
| 2009/0081850 A1 | 3/2009 | Ohnuma et al. | |
| 2009/0236698 A1 | 9/2009 | Yamazaki et al. | |
| 2009/0315085 A1* | 12/2009 | Yamazaki | 257/288 |
| 2010/0081253 A1 | 4/2010 | Kurata et al. | |
| 2011/0075061 A1* | 3/2011 | Yasukawa | 349/41 |
| 2011/0165741 A1 | 7/2011 | Yamazaki et al. | |
| 2012/0161270 A1* | 6/2012 | Maehara et al. | 257/432 |
| 2012/0218495 A1* | 8/2012 | Oshima | 349/61 |
| 2012/0282717 A1* | 11/2012 | Yamazaki et al. | 438/29 |
| 2012/0299031 A1* | 11/2012 | Shiratori | 257/89 |

FOREIGN PATENT DOCUMENTS

| | | |
|---|---|---|
| JP | 2000150905 A | 5/2000 |
| JP | 2000164347 A | 6/2000 |
| JP | 2001195009 A | 7/2001 |
| JP | 2001202035 A | 7/2001 |
| JP | 2004310051 A | 11/2004 |
| JP | 2005093757 A | 4/2005 |
| JP | 2005244197 A | 9/2005 |
| JP | 2005333052 A | 12/2005 |
| JP | 2007-35964 A | 2/2007 |

* cited by examiner

SEMICONDUCTOR DEVICE AND METHOD FOR MANUFACTURING THE SAME

CROSS-REFERENCE TO RELATED APPLICATIONS

This application is a divisional of U.S. application Ser. No. 12/135,344, filed Jun. 9, 2008, now allowed, which claims the benefit of a foreign priority application filed in Japan as Serial No. 2007-157063 on Jun. 14, 2007, both of which are incorporated by reference.

BACKGROUND OF THE INVENTION

1. Field of the Invention

The present invention relates to a substrate having a silicon-on-insulator (SOI) structure where a semiconductor layer is formed by slicing of a crystalline semiconductor substrate and bonded to a substrate of a different kind. In particular, the present invention relates to bonding SOI technology and relates to a method for manufacturing an SOI substrate where a single-crystal or polycrystalline semiconductor layer is bonded to a substrate having an insulating surface such as a glass substrate. The present invention also relates to a display device or a semiconductor device using such a substrate having an SOI structure.

2. Description of the Related Art

Instead of silicon wafers that are manufactured by thinly cutting an ingot of a single-crystal semiconductor, semiconductor substrates called silicon-on-insulator (SOI) substrates have been developed, which have a thin single-crystal semiconductor layer over an insulating layer and are becoming widely used as substrates in manufacturing microprocessors or the like. This is because an integrated circuit using an SOI substrate has attracted attention since parasitic capacitance between drains of transistors and the substrate can be reduced, the performance of a semiconductor integrated circuit can be improved, and the amount of power consumption can be reduced.

As a method for manufacturing SOI substrates, a hydrogen ion implantation separation method is known. In the hydrogen ion implantation separation method, hydrogen ions are implanted into a silicon wafer to form a microbubble layer at a predetermined depth from the surface, and the microbubble layer is used as a cleavage plane to bond a thin silicon layer (SOI layer) to another silicon wafer. In addition to heat treatment for separation of an SOI layer, it is necessary to perform heat treatment in an oxidizing atmosphere to form an oxide film on the SOI layer, remove the oxide film, and perform heat treatment at 1000° C. to 1300° C. in a reducing atmosphere to increase bonding strength.

On the other hand, there has been an attempt to form an SOI layer over an insulating substrate such as a glass substrate. One known example of SOI substrates where an SOI layer is formed over a glass substrate is that in which a thin single-crystal silicon layer is formed over a glass substrate, which has a coating film, by a hydrogen ion implantation separation method (see Reference 1: Japanese Published Patent Application No. H11-163363). Also in this case, hydrogen ions are implanted into a piece of single-crystal silicon to form a microbubble layer at a predetermined depth from the surface; a glass substrate and the piece of single-crystal silicon are bonded together; and the microbubble layer is used as a cleavage plane to separate the piece of silicon, thereby forming a thin silicon layer (SOI layer) over a glass substrate.

In addition, techniques are under development in which a switching element or a driver circuit in an active-matrix electro-optical device, for example, an active-matrix electroluminescent (EL) display device is formed using a thin film transistor (TFT).

SUMMARY OF THE INVENTION

An example of EL display devices has a structure in which a first pixel electrode is famed over a TFT, an EL layer including a light-emitting layer is formed over the first pixel electrode, and a second pixel electrode is further formed over the EL layer.

In many cases, the EL layer is formed to a thickness of 1 nm to 100 nm. Thus, when the first pixel electrode formed below the EL layer is uneven, the EL layer also becomes uneven. When the EL layer is also uneven, the display device may have luminance variation, or the reliability of the display device may be impaired. Therefore, the first pixel electrode needs to have planarity.

With the present invention, an EL display device is manufactured using an SOI substrate. The EL display device is formed in such a manner that a conductive film that is a material of a first pixel electrode is formed over a single-crystal semiconductor substrate before bonding of a single-crystal semiconductor layer, and then, the single-crystal semiconductor layer over the conductive film is removed after bonding of the single-crystal semiconductor substrate to a support substrate. Accordingly, the surface of the conductive film can be made smooth.

As either a first pixel electrode or a second pixel electrode or both of them, a light-transmitting conductive film is used. For such a light-transmitting conductive film, indium tin oxide (ITO) is often used.

It is often the case that a conductive film which is a material of a pixel electrode is a light-transmitting conductive film of ITO or the like, but a reflective conductive film may also be used.

Because a single-crystal semiconductor substrate has a very flat surface, the surface of a conductive film which is formed over a single-crystal semiconductor substrate is also flat. When a first pixel electrode is formed using such a flat conductive film, an EL layer which is formed thereover is also flat. Accordingly, point defects can be prevented.

The present invention relates to a semiconductor device, which includes: a bonding layer over a substrate; an insulating film and a first pixel electrode, which is embedded in the insulating film, over the bonding layer; an island-shaped single-crystal semiconductor layer over the insulating film; a channel formation region and high-concentration impurity regions in the island-shaped single-crystal semiconductor layer; a gate insulating film and a gate electrode over the island-shaped single-crystal semiconductor layer; an interlayer insulating film which covers the island-shaped single-crystal semiconductor layer, the gate insulating film, and the gate electrode; a wiring which electrically connects the high-concentration impurity region and the first pixel electrode to each other over the interlayer insulating film; a partition which covers the interlayer insulating film, the island-shaped single-crystal semiconductor layer, the gate insulating film, and the gate electrode and has an opening in a region over the first pixel electrode; a light-emitting layer formed in a region which is over the first pixel electrode and surrounded by the partition; and a second pixel electrode which is electrically connected to the light-emitting layer over the light-emitting layer and the partition. A surface of the first pixel electrode, which is in contact with the light-emitting layer, is flat (leveled), and a surface where the insulating film is in contact with the island-shaped single-crystal semiconductor layer roughly coincides with a surface where the first pixel electrode is in contact with the light-emitting layer.

In the present invention, the island-shaped single-crystal semiconductor layer is an island-shaped single-crystal silicon layer.

The present invention relates to a method for manufacturing a semiconductor device, including the steps of: forming a first pixel electrode over a semiconductor substrate; forming an insulating film over the first pixel electrode and the semiconductor substrate; implanting ions including hydrogen into the insulating film to form a separation layer having a porous structure in the semiconductor substrate; forming a bonding layer over the insulating film; performing heat treatment in a state in which the semiconductor substrate and a substrate having an insulating surface are superposed on each other with the bonding layer interposed therebetween to generate a crack in the separation layer and to separate the semiconductor substrate at the separation layer while a single-crystal semiconductor layer is left remaining over the substrate having an insulating surface; etching the single-crystal semiconductor layer to form the single-crystal semiconductor layer into an island-shaped single-crystal semiconductor layer and to form a protective layer for the first pixel electrode; forming a gate insulating film and a gate electrode over the island-shaped single-crystal semiconductor layer; adding an impurity element which imparts one conductivity type to the island-shaped single-crystal semiconductor layer with the use of the gate electrode as a mask to form a channel formation region in a region below the gate electrode and to form high-concentration impurity regions which serve as a source region and a drain region in regions where the gate electrode is not formed; etching the protective layer to expose the first pixel electrode; forming an interlayer insulating film which covers the island-shaped single-crystal semiconductor layer, the gate insulating film, and the gate electrode; forming a wiring which electrically connect the high-concentration impurity region and the first electrode to each other over the interlayer insulating film; forming a partition which covers the interlayer insulating film, the island-shaped single-crystal semiconductor layer, the gate insulating film, and the gate electrode and has an opening in a region over the first pixel electrode; forming a light-emitting layer in a region which is over the first pixel electrode and surrounded by the partition; and forming a second pixel electrode which is electrically connected to the light-emitting layer over the light-emitting layer and the partition. A surface of the first pixel electrode, which is in contact with the light-emitting layer, is flat (leveled), and a surface where the island-shaped single-crystal semiconductor layer is in contact with the insulating film roughly coincides with a surface where the first pixel electrode is in contact with the light-emitting layer. Note that the separation layer is also called an embrittlement layer.

In the present invention, the single-crystal semiconductor layer is a single-crystal silicon layer.

In the present invention, the bonding layer is formed of silicon oxide.

In the present invention, the first pixel electrode is formed using a light-transmitting conductive film.

In the present invention, the first pixel electrode is formed using a reflective conductive film.

In accordance with the present invention, a flat pixel electrode can be obtained. Accordingly, point defects can be suppressed, and the reliability of an EL display device can be increased.

In addition, a TFT using a single-crystal semiconductor layer as an active layer is formed. Accordingly, a TFT with high mobility can be formed, and the drive speed of an EL display device can be increased.

DETAILED DESCRIPTION OF THE INVENTION

Figure 1A:
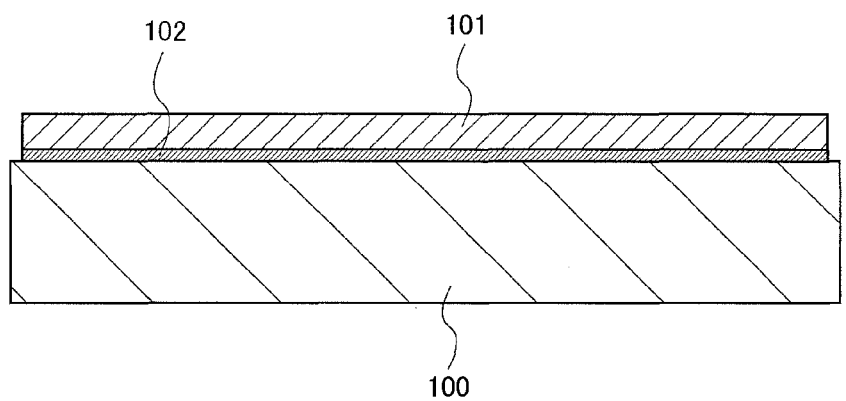
FIGS. 1A and 1B are cross-sectional views each showing a structure of a substrate having an SOI structure.

Embodiment modes of the present invention will be hereinafter described with reference to the drawings. However, the present invention is not limited to the following description, and it is easily understood by those skilled in the art that the mode and detail of the present invention can be modified in various ways without departing from the spirit and scope thereof. Thus, the present invention is not interpreted as being limited to the following description of the embodiment modes. In the modes of the present invention described below, the same components in different diagrams are commonly denoted by the same reference numerals.

[Embodiment Mode 1]

Substrates having an SOI structure of this embodiment mode, semiconductor devices manufactured using an SOI substrate, and a method for manufacturing each of them are described with reference to FIGS. 1A and 1B, 2A to 2C, 3A to 3C, 4A and 4B, 5A to 5C, 6A to 6C, 7A and 7B, 8A to 8C, 9A to 9F, 10A to 10F, 11A to 11E, and 12A to 12E.

First, structures of substrates having an SOI structure are described with reference to FIGS. 1A and 1B, and 2A to 2C.

In FIG. 1A, a supporting substrate 100 refers to an insulating substrate or a substrate having an insulating surface. Glass substrates (also referred to as "non-alkali glass substrates") that are used in the electronics industry, such as aluminosilicate glass substrates, aluminoborosilicate glass substrates, and barium borosilicate glass substrates, are used.

In other words, glass substrates that have a thermal expansion coefficient of $25 \times 10^{-7}/°$ C. to $50 \times 10^{-7}/°$ C. (preferably, $30 \times 10^{-7}/°$ C. to $40 \times 10^{-7}/°$ C.) and a strain point of 580° C. to 680° C. (preferably, 600° C. to 680° C.) can be used. Alternatively, quartz substrates, ceramic substrates, metal substrates with their surfaces covered with an insulating film, and the like can be used.

In this specification, a single-crystal semiconductor layer is referred to as a low-temperature single-crystal semiconductor (LTSS) layer, for which single-crystal silicon is typically used. An LTSS layer 101 shown in FIG. 1A is a single-crystal silicon layer.

Alternatively, as the LTSS layer 101, a crystalline semiconductor layer of silicon, germanium, or a compound semiconductor such as gallium arsenide or indium phosphide, which can be separated from a single-crystal semiconductor substrate or a polycrystalline semiconductor substrate by a hydrogen ion implantation separation method or the like, can be used.

Between the supporting substrate 100 and the LTSS layer 101, a bonding layer 102 which has a smooth surface and forms a hydrophilic surface is provided. This bonding layer 102 is a layer which has a smooth surface and a hydrophilic surface. As a layer which can form such a surface, an insulating layer formed by a chemical reaction is preferable. For example, an oxide semiconductor film formed by a thermal or chemical reaction is suitable. The main reason is that a film formed by a chemical reaction can ensure its surface smoothness.

The bonding layer 102 which has a smooth surface and forms a hydrophilic surface is provided at a thickness of 0.2 nm to 500 nm. With this thickness, it is possible to smooth surface roughness of a surface on which a film is to be formed and also to ensure smoothness of a growing surface of the film.

When the LTSS layer 101 is formed of silicon, the bonding layer 102 can be formed using a silicon oxide which is formed by heat treatment in an oxidizing atmosphere, a silicon oxide which grows by reaction of oxygen radicals, a chemical oxide which is formed with an oxidizing chemical solution, or the like.

When a chemical oxide is used for the bonding layer 102, the bonding layer 102 may have a thickness of 0.1 nm to 1 nm. Preferably, the bonding layer 102 is formed of a silicon oxide that is deposited by a chemical vapor deposition method. In this case, a silicon oxide film manufactured by a chemical vapor deposition method using an organic silane gas is preferable.

Examples of organic silane gases that can be used include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

The bonding layer 102 is provided on the LTSS layer 101 side and located in contact with the surface of the supporting substrate 100, whereby a bond can be formed even at room temperature. In order to form a stronger bond, the supporting substrate 100 and the LTSS layer 101 may be pressed against each other. In bonding the supporting substrate 100 and the bonding layer 102 which are of different kinds of materials, the surfaces are cleaned. When the cleaned surface of the supporting substrate 100 and that of the bonding layer 102 are located in contact with each other, a bond is formed by an attracting force between the surfaces.

It is more preferable for formation of a bond that the surface of the supporting substrate 100 be subjected to treatment for attaching a plurality of hydrophilic groups to the surface. For example, it is preferable that the surface of the supporting substrate 100 be subjected to oxygen plasma treatment or ozone treatment so that the surface becomes hydrophilic.

When the surface of the supporting substrate 100 is subjected to treatment for making the surface hydrophilic, hydroxyl groups on the surface act to form a bond by hydrogen bonding. Furthermore, when heating is performed at room temperature or higher, bonding strength can be made to be higher than that of the bond formed by locating cleaned surfaces in contact with each other.

As treatment for bonding of the supporting substrate 100 and the bonding layer 102 which are of different kinds of materials, surfaces which are to form a bond may be cleaned by being irradiated with an ion beam obtained from an inert gas such as argon. By irradiation with an ion beam, dangling bonds are exposed on the surface of the supporting substrate 100 or the bonding layer 102, and a very active surface is formed.

If such activated surfaces are located in contact with each other, a bond between the supporting substrate 100 and the bonding layer 102 can be formed even at low temperature. A method of forming a bond after surface activation is preferably performed in vacuum because the surface needs to have a high degree of cleanness.

The LTSS layer 101 is formed by slicing of a crystalline semiconductor substrate. For example, when a single-crystal silicon substrate is used as a single-crystal semiconductor substrate, the LTSS layer 101 can be formed by an ion implantation separation method in which ions of hydrogen or fluorine are implanted into the single-crystal silicon substrate to a predetermined depth and then heat treatment is performed to separate a superficial single-crystal silicon layer. Alternatively, a method may be employed in which single-crystal silicon is epitaxially grown on porous silicon and then a porous silicon layer is separated by cleavage with water jetting. The thickness of the LTSS layer 101 is 5 nm to 500 nm, preferably, 10 nm to 200 nm.

Figure 1B:
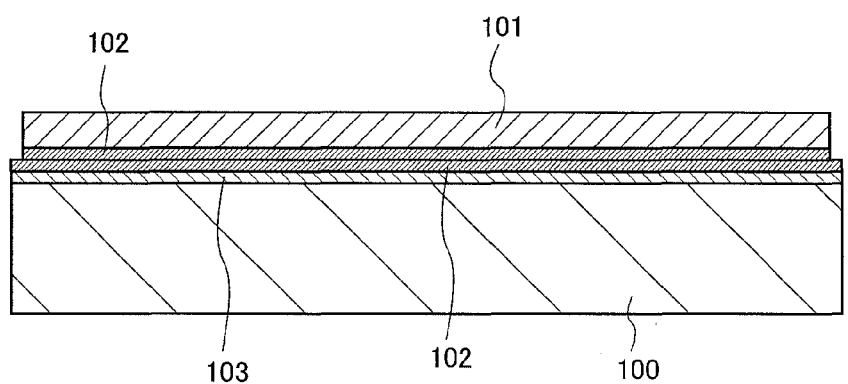

FIG. 1B shows a structure in which the supporting substrate 100 is provided with a barrier layer 103 and the bonding layer 102. By provision of the barrier layer 103, the LTSS layer 101 can be prevented from being contaminated by a mobile ion impurity like alkali metal or alkaline earth metal that is diffused from a glass substrate that is used as the supporting substrate 100. Over the barrier layer 103, the bonding layer 102 is preferably provided.

By provision of the barrier layer 103 which prevents impurity diffusion and the bonding layer 102 which ensures bonding strength, that is, a plurality of layers with different functions over the supporting substrate 100, the range of choices of the supporting substrate can be expanded. It is preferable that the bonding layer 102 be provided also on the LTSS layer 101 side. That is, in bonding the LTSS layer 101 to the supporting substrate 100, it is preferable that one or both of surfaces that are to form a bond be provided with the bonding layer 102, whereby bonding strength can be increased.

Figure 2A:
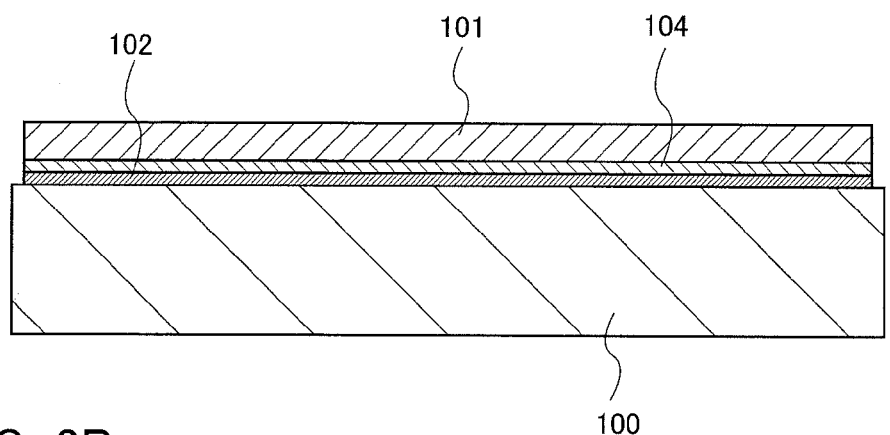
FIGS. 2A to 2C are cross-sectional views each showing a structure of a substrate having an SOI structure.

FIG. 2A shows a structure in which an insulating layer 104 is provided between the LTSS layer 101 and the bonding layer 102. It is preferable that the insulating layer 104 be a nitrogen-containing insulating layer. For example, the insulating layer 104 can be formed by using a single film or a plurality of stacked films selected from a silicon nitride film, an oxygen-containing silicon nitride film, and a nitrogen-containing silicon oxide film.

For example, as the insulating layer 104, a stacked-layer film can be used which is obtained by stacking a nitrogen-containing silicon oxide film and an oxygen-containing silicon nitride film from the LTSS layer 101 side. The bonding layer 102 functions to form a bond with the supporting substrate 100, whereas the insulating layer 104 prevents the LTSS layer 101 from being contaminated by an impurity.

Note that here, a silicon oxynitride film corresponds to a film which contains much oxygen than nitrogen, and in the case where measurement is performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film corresponds to a film which contains much nitrogen than oxygen and includes oxygen, nitrogen, silicon, and hydrogen at concentrations ranging from 5 to 30 at. %, 20 to 55 at. %, 25 to 35 at. %, and 10 to 30 at. %, respectively, in the case where measurement is performed using RBS and HFS. Note that percentages of nitrogen, oxygen, silicon, and hydrogen fall within the ranges given above if the total number of atoms contained in the silicon oxynitride film or the silicon nitride oxide film is defined as 100 at. %.

Figure 2B:
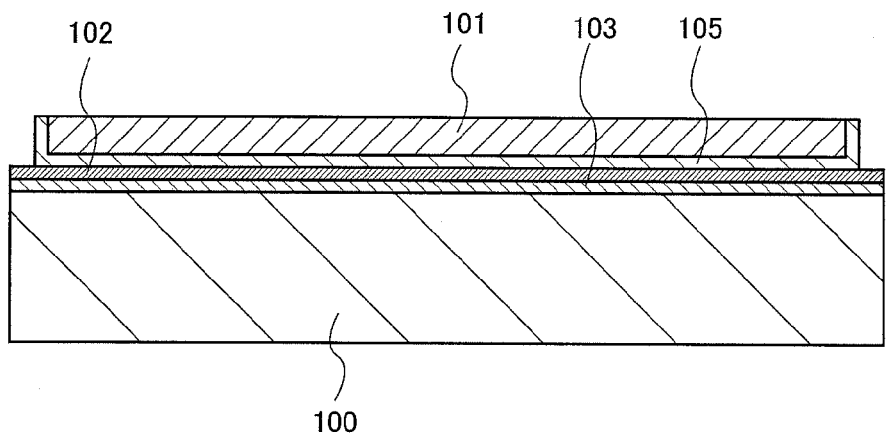

FIG. 2B shows a structure in which the supporting substrate 100 is provided with the bonding layer 102. Between the supporting substrate 100 and the bonding layer 102, the barrier layer 103 is preferably provided. This is in order to prevent the LTSS layer 101 from being contaminated by a mobile ion impurity like alkali metal or alkaline earth metal that is diffused from a glass substrate that is used as the supporting substrate 100. On the LTSS layer 101, a silicon oxide layer 105 is formed by direct oxidation. This silicon oxide layer 105 forms a bond with the bonding layer 102 and fixes the LTSS layer over the supporting substrate 100. It is preferable that the silicon oxide layer 105 be formed by thermal oxidation.

Figure 2C:
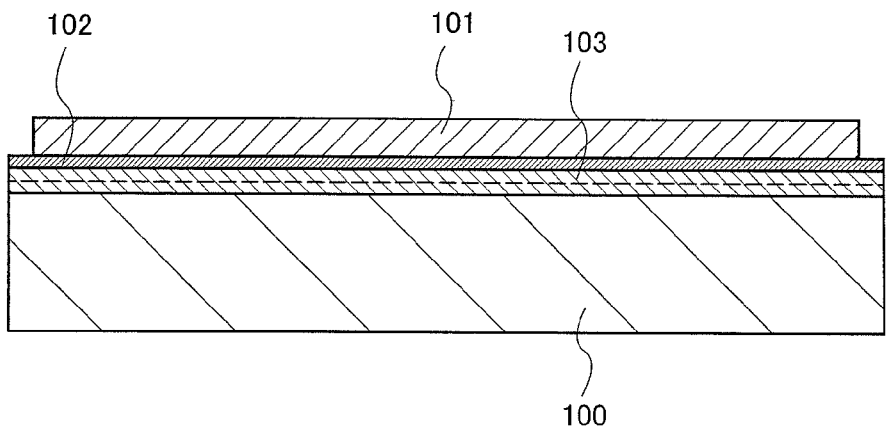

FIG. 2C shows another structure in which the supporting substrate 100 is provided with the bonding layer 102. Between the supporting substrate 100 and the bonding layer 102, the barrier layer 103 is provided.

In FIG. 2C, the barrier layer 103 is formed of a single layer or a plurality of layers. For example, a silicon nitride film or an oxygen-containing silicon nitride film which is highly effective in blocking ions of sodium or the like is used as a first layer, and a silicon oxide film or a nitrogen-containing silicon oxide film is provided thereover as a second layer.

The first layer of the barrier layer 103 is an insulating film and is a dense film with a purpose to prevent impurity diffusion, whereas one of purposes of the second layer is to relax stress so that internal stress of the film of the first layer does not affect the upper layer. By provision of the barrier layer 103 over the supporting substrate 100 as described above, the range of choices of the substrate in bonding the LTSS layer can be expanded.

Over the barrier layer 103, the bonding layer 102 is formed to fix the supporting substrate 100 and the LTSS layer 101.

Methods for manufacturing the substrates having an SOI structure shown in FIGS. 1A and 1B, and 2A to 2C are described with reference to FIGS. 3A to 3C, 4A and 4B, 5A to 5C, 6A to 6C, 7A and 7B, and 8A to 8C.

Figure 3A:
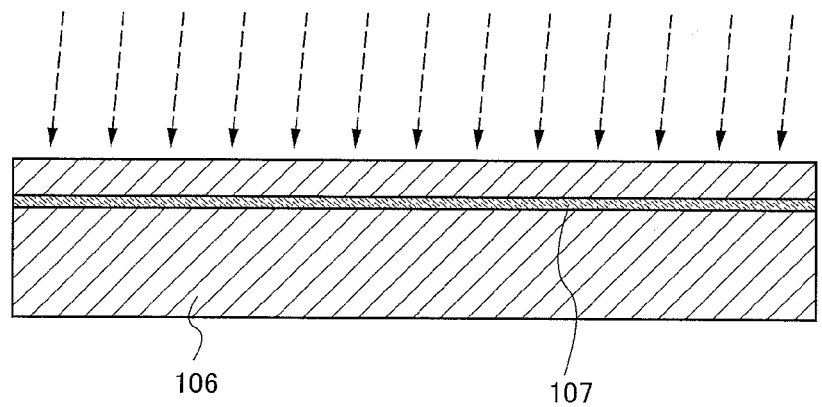
FIGS. 3A to 3C are cross-sectional views showing a method for manufacturing a substrate having an SOI structure.

Ions that are accelerated by an electric field are implanted to a predetermined depth from a cleaned surface of a semiconductor substrate 106, thereby forming a separation layer 107 (see FIG. 3A). The depth at which the separation layer 107 is formed in the semiconductor substrate 106 is controlled by ion accelerating energy and ion incident angle. The separation layer 107 is formed in a region at a depth close to the average penetration depth of the ions from the surface of the semiconductor substrate 106. For example, the thickness of an LTSS layer is 5 nm to 500 nm, preferably, 10 nm to 200 nm, and the accelerating voltage at the time of implanting ions is determined in consideration of such a thickness. Ion implantation is preferably performed using an ion doping apparatus. That is, a doping method is used, by which a plurality of ion species that is generated from a plasma of a source gas is implanted without any mass separation being performed.

In this embodiment mode, it is preferable that ions of one or a plurality of the same atoms with different masses be implanted. Ion doping may be performed with an accelerating voltage of 10 kV to 100 kV, preferably, 30 kV to 80 kV, at a dose of $1\times10^{16}/cm^2$ to $4\times10^{16}/cm^2$, and with a beam current density of 2 $\mu A/cm^2$ or more, preferably, 5 $\mu A/cm^2$ or more, more preferably, 10 $\mu A/cm^2$ or more.

In the case of implanting hydrogen ions, the hydrogen ions preferably include $H^+$, $H_2^+$, and $H_3^+$ ions with a high proportion of $H_3^+$ ions. In the case of implanting hydrogen ions, when the hydrogen ions are made to include $H^+$, $H_2^+$, and $H_3^+$ ions with a high proportion of $H_3^+$ ions, implantation efficiency can be increased and implantation time can be shortened. Accordingly, the separation layer 107 formed in the semiconductor substrate 106 can be made to contain hydrogen at $1\times10^{20}/cm^3$ (preferably, $5\times10^{20}/cm^3$) or more.

When a high-concentration hydrogen-implanted region is locally formed in the semiconductor substrate 106, a crystal structure is disordered and microvoids are formed, whereby the separation layer 107 can be made to have a porous structure. In this case, by heat treatment at relatively low temperature, a change occurs in the volume of the microvoids formed in the separation layer 107, which enables cleavage to occur along the separation layer 107 and enables a thin LTSS layer to be formed.

Even if ions are implanted into the semiconductor substrate 106 with mass separation being performed, the separation layer 107 can be similarly formed as described above. In this case, selective implantation of ions with large mass (for example, $H_3^+$ ions) is also preferable because similar effects to those described above can be achieved.

As a gas from which ions are generated, deuterium or an inert gas such as helium, as well as hydrogen, can be selected. By use of helium as a source gas and an ion doping apparatus which does not have a mass separation function, an ion beam with a high proportion of $He^+$ ions can be obtained. By implantation of such ions into the semiconductor substrate 106, microvoids can be formed and the separation layer 107 similar to that described above can be formed in the semiconductor substrate 106.

In formation of the separation layer 107, ions need to be implanted at a high dose, and there are cases where the surface of the semiconductor substrate 106 be roughened. Therefore, a surface, through which ions are implanted, may be provided with a dense film. For example, a protective film against ion implantation, which is made of a silicon nitride film, an oxygen-containing silicon nitride film, or the like, may be provided at a thickness of 50 nm to 200 nm.

Figure 3B:
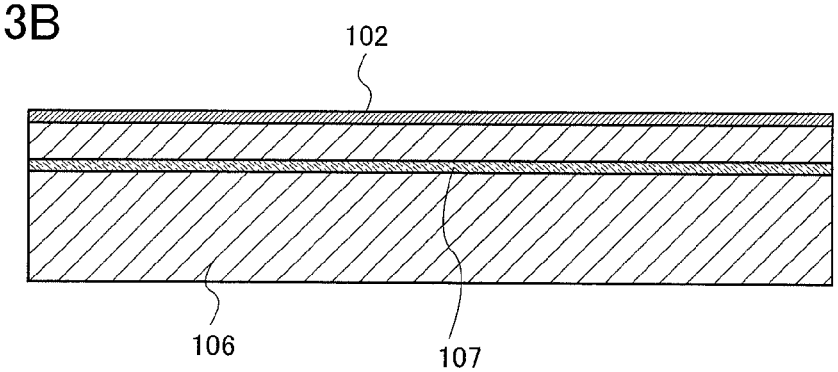

Next, a silicon oxide film is formed as a bonding layer 102 on a surface which is to form a bond with a supporting substrate 100 (see FIG. 3B). The thickness of the silicon oxide film may be 10 nm to 200 nm, preferably, 10 nm to 100 nm, more preferably, 20 nm to 50 nm.

As the silicon oxide film, a silicon oxide film formed by a chemical vapor deposition method using an organic silane gas as described above is preferable. Alternatively, a silicon oxide film formed by a chemical vapor deposition method using a silane gas can be used. Film formation by a chemical vapor deposition method is performed at a temperature, for example, 350° C. or lower, at which degassing of the separation layer 107 that is formed in a single-crystal semiconductor substrate does not occur. In addition, heat treatment for separation of an LTSS layer from a single-crystal or polycrystalline semiconductor substrate is performed at a temperature higher than the temperature at which the silicon oxide film is formed.

Figure 3C:
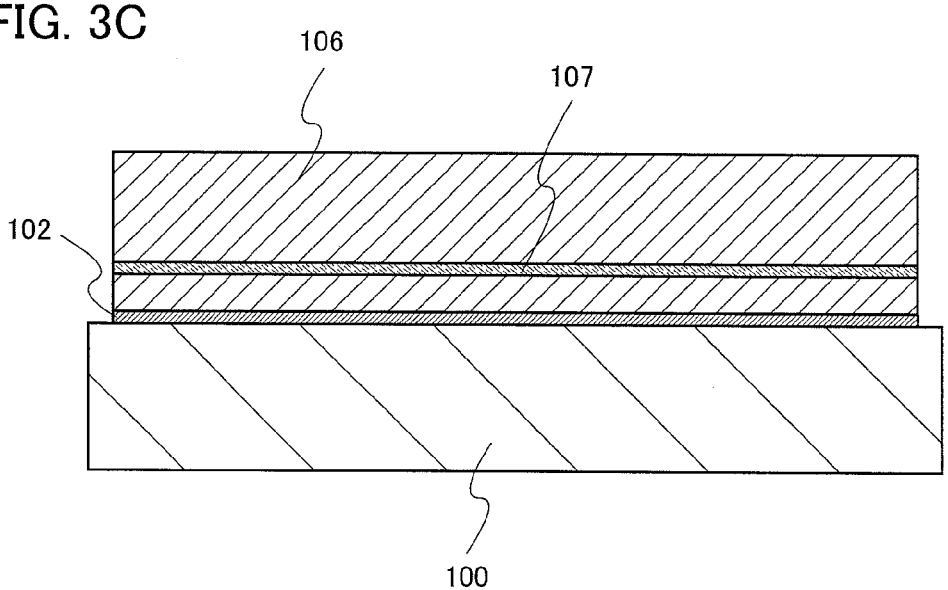

A bond is formed by making the supporting substrate 100 and the surface of the semiconductor substrate 106 where the bonding layer 102 is formed face each other and be in contact with each other (see FIG. 3C). A surface which is to form a bond is cleaned sufficiently. Then, the supporting substrate 100 and the bonding layer 102 are located in contact with each other, whereby a bond is formed. It can be considered that Van der Waals forces act at the initial stage of bonding and that a strong bond due to hydrogen bonding can be formed by pressure bonding of the supporting substrate 100 and the semiconductor substrate 106.

In order to form a favorable bond, a surface may be activated. For example, the surface which is to form a bond is irradiated with an atomic beam or an ion beam. When an atomic beam or an ion beam is used, an inert gas neutral atom beam or inert gas ion beam of argon or the like can be used. Alternatively, plasma irradiation or radical treatment is performed. Such surface treatment makes it possible to increase bonding strength between different kinds of materials even at a temperature of 200° C. to 400° C.

First heat treatment is performed in a state where the semiconductor substrate 106 and the supporting substrate 100 are superposed on each other. By the first heat treatment, separation of the semiconductor substrate 106 is performed while a thin semiconductor layer (LTSS layer) is left remaining over the supporting substrate 100 (see FIG. 4A). The first heat treatment is preferably performed at a temperature equal to or higher than the temperature at which the bonding layer 102 is formed, preferably at equal to or higher than 400° C. to lower than 600° C. Through the heat treatment performed within this temperature range, a change occurs in the volume of the microvoids formed in the separation layer 107, which allows a semiconductor layer to be cleaved along the separation layer 107. Because the bonding layer 102 is bonded to the supporting substrate 100, an LTSS layer 101 having the same crystallinity as that of the semiconductor substrate 106 is fixed over the supporting substrate 100 in this mode.

Figure 4A:
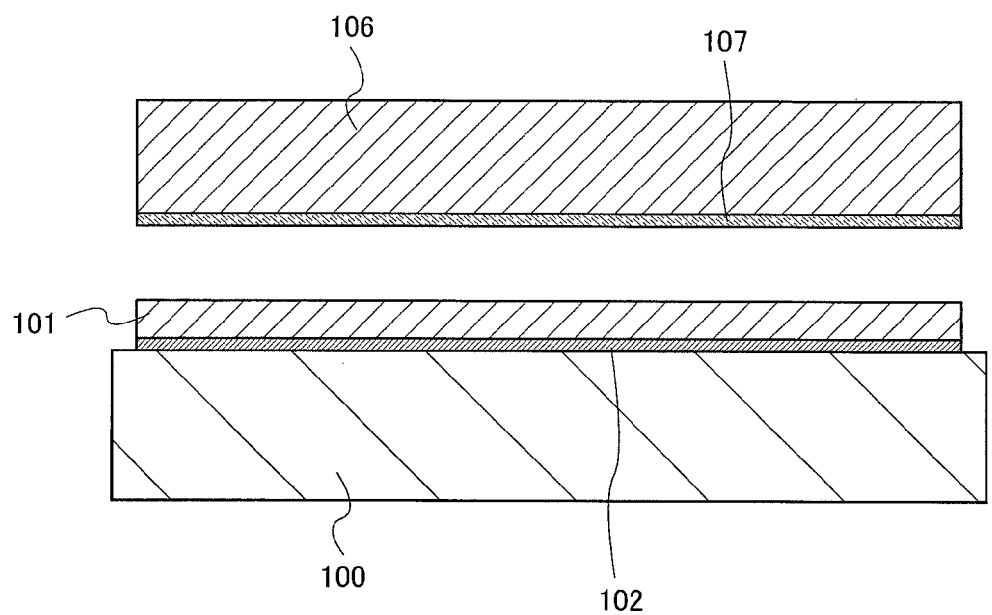
FIGS. 4A and 4B are cross-sectional views showing a method for manufacturing a substrate having an SOI structure.
Figure 4B:
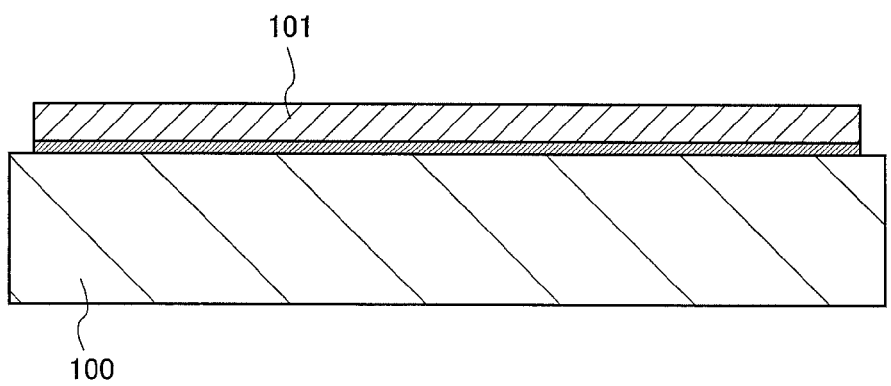

Next, second heat treatment is performed in a state where the LTSS layer 101 is bonded to the supporting substrate 100 (see FIG. 4B). It is preferable that the second heat treatment be performed at a temperature higher than the temperature of the first heat treatment and lower than the strain point of the supporting substrate 100. Alternatively, even if the first heat treatment and the second heat treatment are performed at the same temperature, it is preferable that the second heat treatment be performed for a longer period of treatment time. The heat treatment may be performed so that the supporting substrate 100 and/or the LTSS layer 101 are/is heated by thermal conduction heating, convection heating, radiation heating, or the like. As a heat treatment apparatus, an electrically heated oven, a lamp annealing furnace, or the like can be used. The second heat treatment may be performed with multilevel changes of temperature. Alternatively, a rapid thermal annealing (RTA) apparatus may be used. If the heat treatment is performed using an RTA apparatus, heating up to near a substrate strain point or a slightly higher temperature is also possible.

Through the second heat treatment, residual stress of the LTSS layer 101 can be relaxed. That is, the second heat treatment can relax thermal distortion caused by a difference in coefficient of expansion between the supporting substrate 100 and the LTSS layer 101. In addition, the second heat treatment is effective in recovering the crystallinity of the LTSS layer 101, which is impaired by ion implantation. Furthermore, the second heat treatment is also effective in recovering damage of the LTSS layer 101, which is caused when the semiconductor substrate 106 is bonded to the supporting substrate 100 and then divided by the first heat treatment. Moreover, by the first heat treatment and the second heat treatment, hydrogen bonds can be changed into stronger covalent bonds.

For the purpose of planarization of the surface of the LTSS layer 101, a chemical mechanical polishing (CMP) process may be performed. The CMP process can be performed after the first heat treatment or the second heat treatment. Note that, when the CMP process is performed before the second heat treatment, it is possible to recover a damaged layer on the surface due to the CMP process as well as planarizing the surface of the LTSS layer 101.

In any event, by the first heat treatment and the second heat treatment performed in combination as described in this mode, a crystalline semiconductor layer with excellent crystallinity can be provided over a supporting substrate which is weak against heat, such as a glass substrate.

Through the steps of FIGS. 3A to 3C and FIGS. 4A and 4B, the SOI substrate shown in FIG. 1A is formed.

A method for forming the substrate having an SOI structure shown in FIG. 1B is described with reference to FIGS. 7A and 7B.

Based on the manufacturing steps shown in FIGS. 3A and 3B, a separation layer 107 is formed in a semiconductor substrate 106, and a bonding layer 102 is formed on a surface of the semiconductor substrate 106 which is to form a bond with a supporting substrate 100.

Figure 7A:
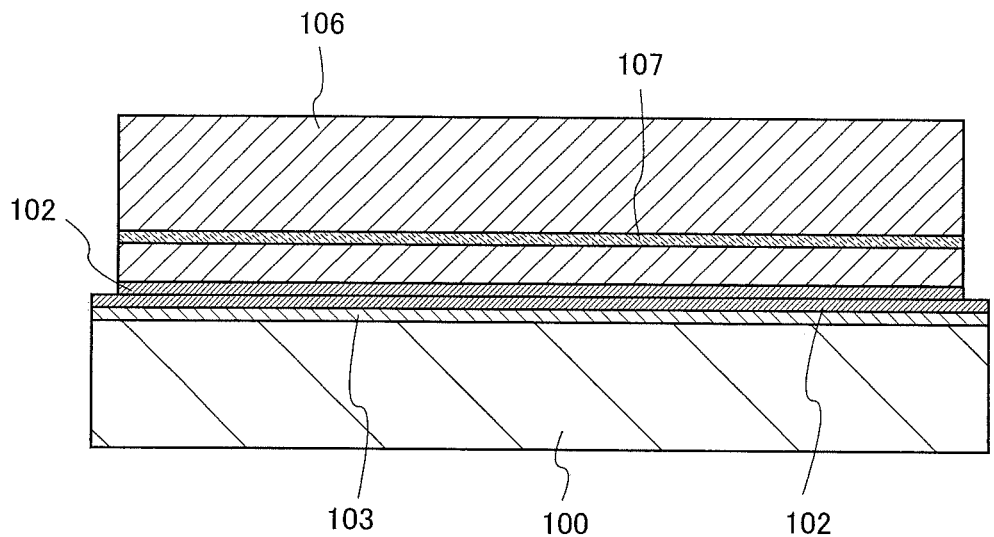
FIGS. 7A and 7B are cross-sectional views showing a method for manufacturing a substrate having an SOI structure.
Figure 7B:
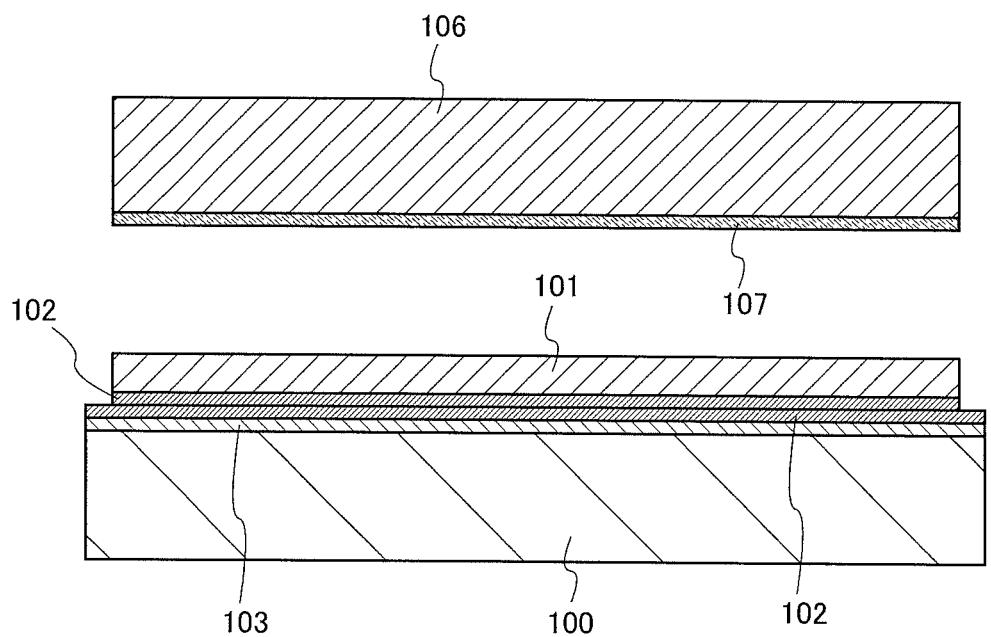

Next, the supporting substrate 100 provided with a barrier layer 103 and a bonding layer 102 and the bonding layer 102 of the semiconductor substrate 106 are located in contact with each other, thereby forming a bond (see FIG. 7A).

In this state, first heat treatment is performed. The first heat treatment is preferably performed at a temperature equal to or higher than the temperature at which the bonding layer 102 is formed, preferably at equal to or higher than 400° C. to lower than 600° C. Accordingly, a change occurs in the volume of the microvoids formed in the separation layer 107, which can cause cleavage in the semiconductor substrate 106. Over the supporting substrate 100, an LTSS layer 101 having the same crystallinity as that of the semiconductor substrate 106 is formed (see FIG. 7B).

Next, second heat treatment is performed in a state where the LTSS layer 101 is bonded to the supporting substrate 100. It is preferable that the second heat treatment be performed at a temperature higher than the temperature of the first heat treatment and lower than the strain point of the supporting substrate 100. Alternatively, even if the first heat treatment and the second heat treatment are performed at the same temperature, it is preferable that the second heat treatment be performed for a longer period of treatment time. The heat treatment may be performed so that the supporting substrate 100 and/or the LTSS layer 101 are/is heated by thermal conduction heating, convection heating, radiation heating, or the like. Through the second heat treatment, residual stress of the LTSS layer 101 can be relaxed, and the second heat treatment is also effective in recovering the damage of the LTSS layer 101 caused by division through the first heat treatment.

In the above-described manner, the SOI substrate shown in FIG. 1B is formed.

Next, a method for manufacturing the substrate having an SOI structure shown in FIG. 2A is described with reference to FIGS. 8A to 8C.

First, based on the manufacturing step shown in FIG. 3A, a separation layer 107 is formed in a semiconductor substrate 106.

Next, an insulating layer 104 is formed on the surface of the semiconductor substrate 106. It is preferable that the insulating layer 104 be a nitrogen-containing insulating layer. For example, the insulating layer 104 can be formed using a single film or a plurality of stacked films selected from a silicon nitride film, an oxygen-containing silicon nitride film, and a nitrogen-containing silicon oxide film.

Figure 8A:
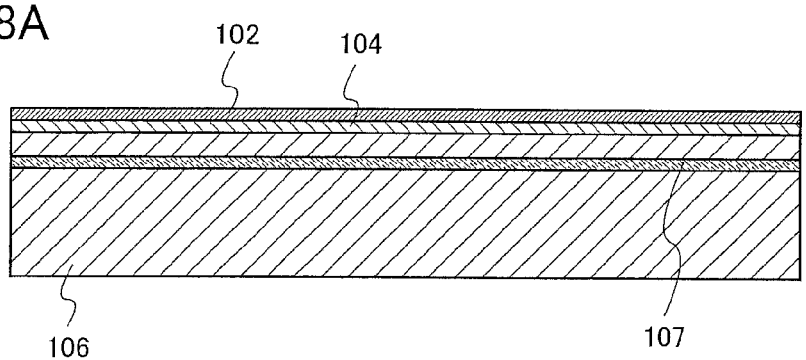
FIGS. 8A to 8C are cross-sectional views showing a method for manufacturing a substrate having an SOI structure.

Furthermore, a silicon oxide film is formed as a bonding layer 102 over the insulating layer 104 (see FIG. 8A).

Figure 8B:
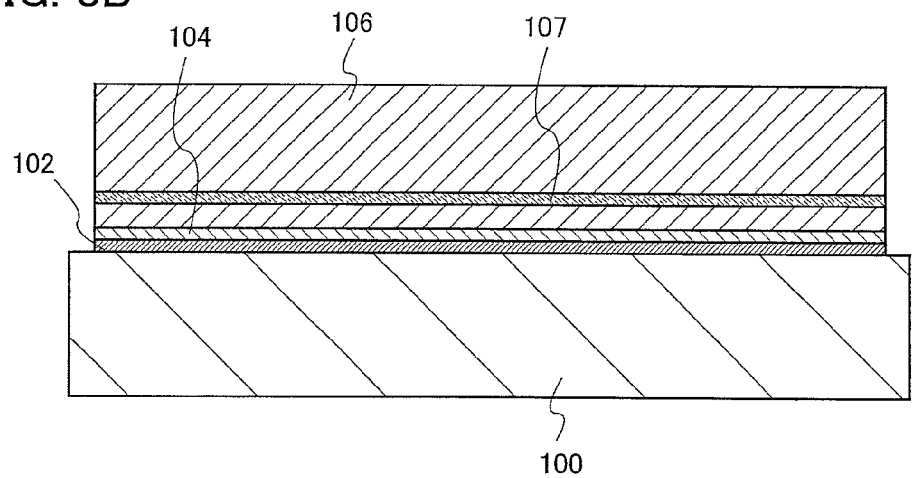

A bond is formed by making a supporting substrate 100 and the surface of the semiconductor substrate 106 where the bonding layer 102 is formed face each other and be in contact with each other (see FIG. 8B).

In this state, first heat treatment is performed. The first heat treatment is preferably performed at a temperature equal to or higher than the temperature at which the bonding layer 102 is formed, preferably at equal to or higher than 400° C. to lower than 600° C. Accordingly, a change occurs in the volume of the microvoids formed in the separation layer 107, which can cause cleavage in the semiconductor substrate 106. Over the supporting substrate 100, an LTSS layer 101 having the same crystallinity as that of the semiconductor substrate 106 is formed (see FIG. 8C).

Next, second heat treatment is performed in a state where the LTSS layer 101 is bonded to the supporting substrate 100. It is preferable that the second heat treatment be performed at a temperature higher than the temperature of the first heat treatment and lower than the strain point of the supporting substrate 100. Alternatively, even if the first heat treatment and the second heat treatment are performed at the same temperature, it is preferable that the second heat treatment be performed for a longer period of treatment time. The heat treatment may be performed so that the supporting substrate 100 and/or the LTSS layer 101 are/is heated by thermal conduction heating, convection heating, radiation heating, or the like. Through the second heat treatment, residual stress of the LTSS layer 101 can be relaxed, and the second heat treatment is also effective in recovering the damage of the LTSS layer 101 caused by division through the first heat treatment.

Figure 8C:
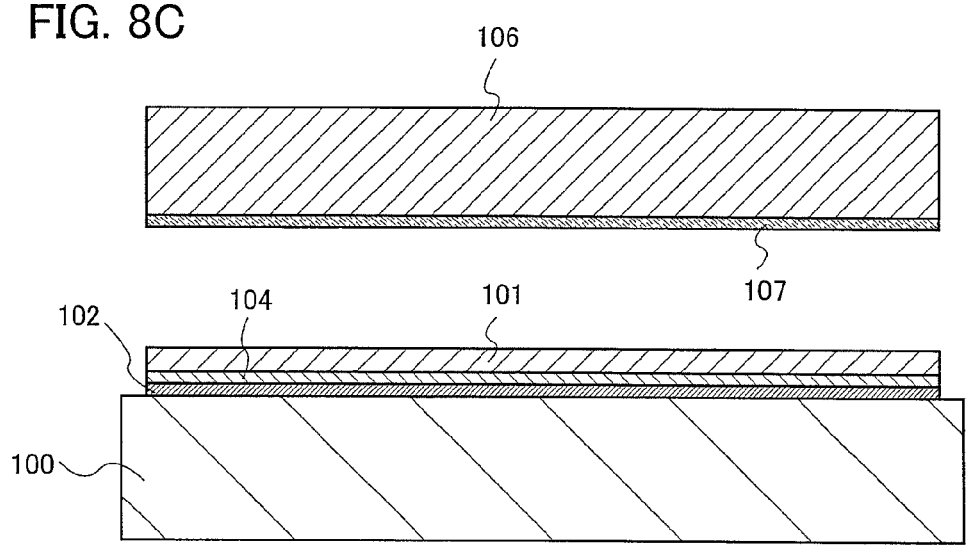

When the insulating layer 104 is formed over the semiconductor substrate 106 as shown in FIGS. 8A to 8C, the insulating layer 104 prevents an impurity from being mixed into the LTSS layer 101; accordingly, the LTSS layer 101 can be prevented from being contaminated.

Figure 5A:
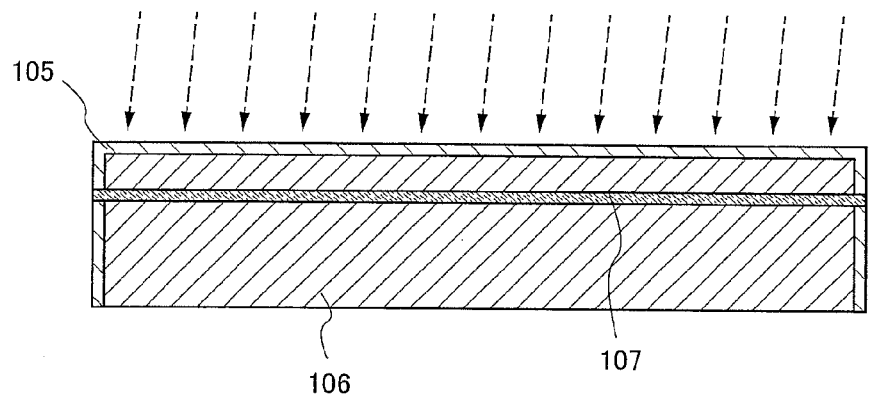
FIGS. 5A to 5C are cross-sectional views showing a method for manufacturing a substrate having an SOI structure.
Figure 5B:
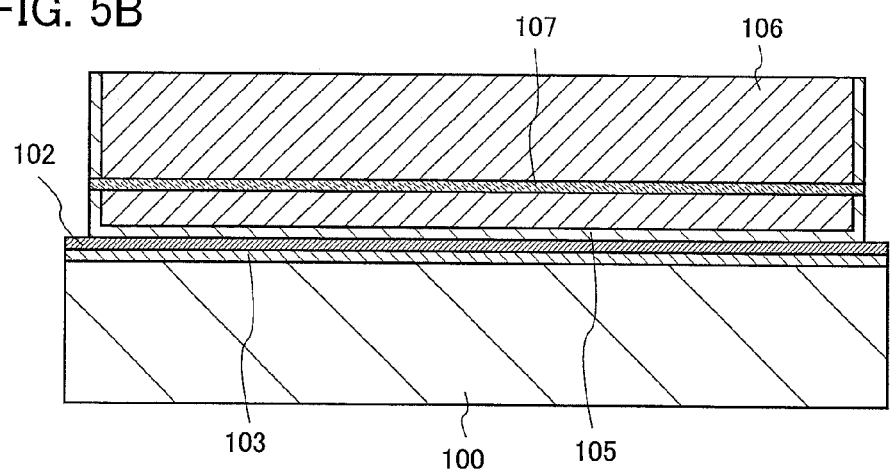
Figure 5C:
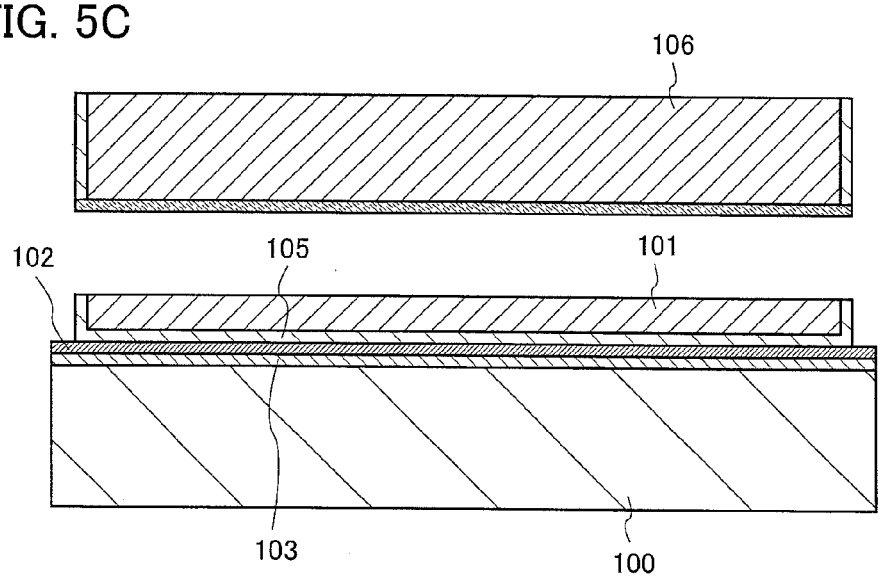

FIGS. 5A to 5C show steps of providing a bonding layer on a supporting substrate side and manufacturing a substrate having an SOI structure with an LTSS layer.

First, ions that are accelerated by an electric field are implanted into a semiconductor substrate 106, which is provided with a silicon oxide layer 105, to a predetermined depth, thereby forming a separation layer 107 (see FIG. 5A). The silicon oxide layer 105 may be formed over the semiconductor substrate 106 by a sputtering method or a CVD method, or when the semiconductor substrate 106 is a single-crystal silicon substrate, the silicon oxide layer 105 may be formed by thermal oxidation of the semiconductor substrate 106. In this embodiment mode, the semiconductor substrate 106 is a single-crystal silicon substrate, and the silicon oxide layer 105 is formed by thermal oxidation of the single-crystal silicon substrate.

The implantation of ions into the semiconductor substrate 106 is performed in a similar manner to the case of FIG. 3A. By formation of the silicon oxide layer 105 on the surface of the semiconductor substrate 106, the surface can be prevented from being damaged by ion implantation and losing its planarity.

A supporting substrate 100 provided with a barrier layer 103 and a bonding layer 102 and the surface of the semiconductor substrate 106 where the silicon oxide layer 105 is formed are located in contact with each other, thereby forming a bond (see FIG. 5B).

In this state, first heat treatment is performed. The first heat treatment is preferably performed at a temperature equal to or higher than the temperature at which the bonding layer 102 is formed, preferably at equal to or higher than 400° C. to lower than 600° C. Accordingly, a change occurs in the volume of the microvoids formed in the separation layer 107, which can cause cleavage in the semiconductor substrate 106. Over the supporting substrate 100, an LTSS layer 101 having the same crystallinity as that of the semiconductor substrate 106 is formed (see FIG. 5C).

Next, second heat treatment is performed in a state where the LTSS layer 101 is bonded to the supporting substrate 100. It is preferable that the second heat treatment be performed at a temperature higher than the temperature of the first heat treatment and lower than the strain point of the supporting substrate 100. Alternatively, even if the first heat treatment and the second heat treatment are performed at the same temperature, it is preferable that the second heat treatment be performed for a longer period of treatment time. The heat treatment may be performed so that the supporting substrate 100 and/or the LTSS layer 101 are/is heated by thermal conduction heating, convection heating, radiation heating, or the like. Through the second heat treatment, residual stress of the LTSS layer 101 can be relaxed, and the second heat treatment is also effective in recovering the damage of the LTSS layer 101 caused by division through the first heat treatment.

In the above-described manner, the SOI substrate shown in FIG. 2B is formed.

Figure 6A:
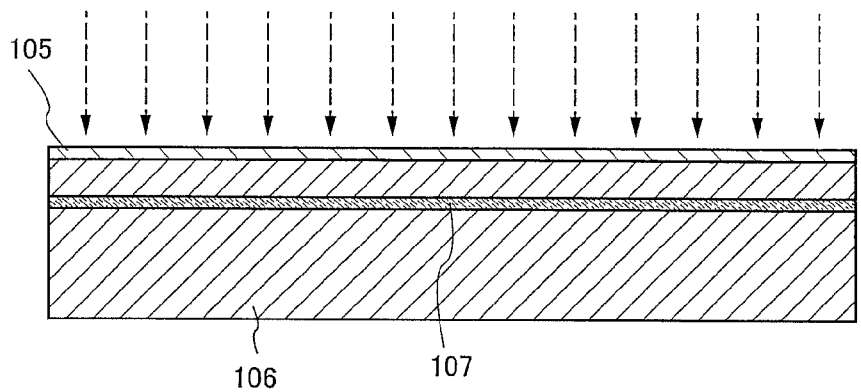
FIGS. 6A to 6C are cross-sectional views showing a method for manufacturing a substrate having an SOI structure.
Figure 6B:
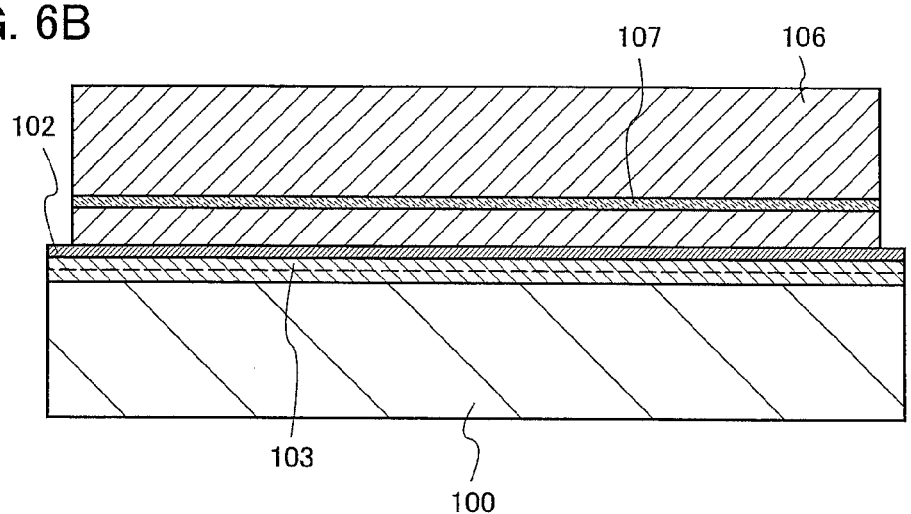
Figure 6C:
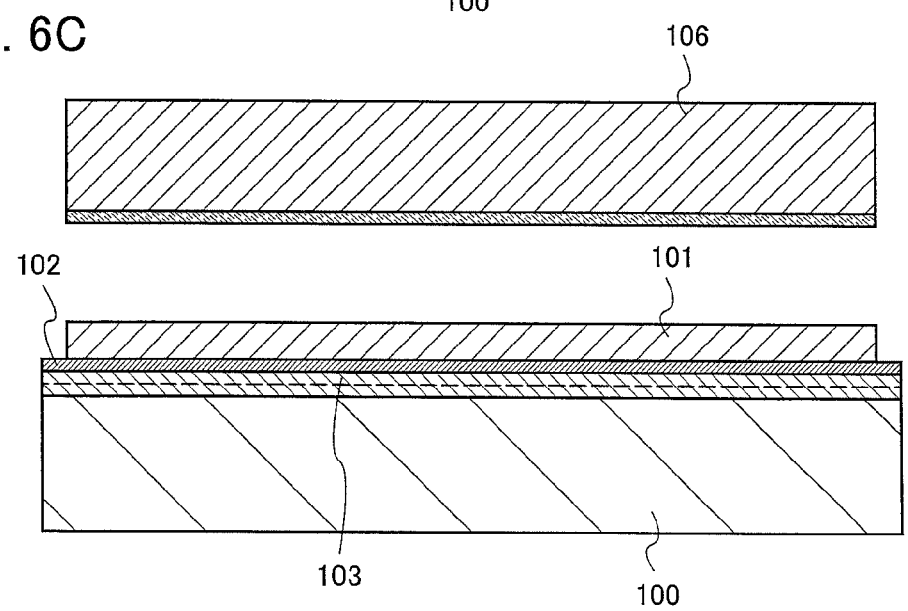

FIGS. 6A to 6C show another example in the case where a bonding layer is provided on a supporting substrate side to bond an LTSS layer.

First, a separation layer 107 is formed in a semiconductor substrate 106 (see FIG. 6A). The implantation of ions for formation of the separation layer 107 is performed using an ion doping apparatus. In this step, the semiconductor substrate 106 is irradiated with ions with different masses which are accelerated by a high electric field.

At this time, it is preferable that a silicon oxide layer 105 be provided as a protective film because the planarity of the surface of the semiconductor substrate 106 may be impaired by ion irradiation. The silicon oxide layer 105 may be formed by thermal oxidation or by using a chemical oxide. A chemical oxide can be formed by immersion of the semiconductor substrate 106 in an oxidizing chemical solution. For example, by treatment of the semiconductor substrate 106 with an ozone-containing aqueous solution, a chemical oxide is formed on the surface.

Alternatively, as the protective film, a nitrogen-containing silicon oxide film or an oxygen-containing silicon nitride film formed by a plasma CVD method, or a silicon oxide film formed using TEOS may be used.

It is preferable that a supporting substrate 100 be provided with a barrier layer 103. By provision of the barrier layer 103, an LTSS layer 101 can be prevented from being contaminated by a mobile ion impurity like alkali metal or alkaline earth metal that is diffused from a glass substrate that is used as the supporting substrate 100.

The barrier layer 103 is formed of a single layer or a plurality of layers. For example, a silicon nitride film or an oxygen-containing silicon nitride film which is highly effective in blocking ions of sodium or the like is used as a first layer, and a silicon oxide film or a nitrogen-containing silicon oxide film is provided thereover as a second layer.

The first layer of the barrier layer 103 is an insulating film and is a dense film with a purpose to prevent impurity diffusion, whereas one of purposes of the second layer is to relax stress so that internal stress of the film of the first layer does not affect the upper layer. By provision of the barrier layer 103 over the supporting substrate 100 as described above, the range of choices of the substrate in bonding the LTSS layer can be expanded.

The supporting substrate 100 provided with a bonding layer 102 over the barrier layer 103 and the semiconductor substrate 106 are bonded together (see FIG. 6B). The surface of the semiconductor substrate 106 is exposed by removal of the silicon oxide layer 105, which has been provided as a protective film, with a hydrofluoric acid. The outermost surface of the semiconductor substrate 106 may be in a state where the surface is terminated with hydrogen by treatment with a hydrofluoric acid solution. In formation of the bond, hydrogen bonds are formed by surface-terminating hydrogen, and a favorable bond can be formed.

Furthermore, irradiation with ions of an inert gas may be performed so that dangling bonds are exposed on the outermost surface of the semiconductor substrate 106, and a bond may be formed in vacuum.

In this state, first heat treatment is performed. The first heat treatment is preferably performed at a temperature equal to or higher than the temperature at which the bonding layer 102 is formed, preferably, at equal to or higher than 400° C. to lower than 600° C. Accordingly, a change occurs in the volume of the microvoids formed in the separation layer 107, which can cause cleavage in the semiconductor substrate 106. Over the supporting substrate 100, an LTSS layer 101 having the same crystallinity as that of the semiconductor substrate 106 is formed (see FIG. 6C).

Next, second heat treatment is performed in a state where the LTSS layer 101 is bonded to the supporting substrate 100. It is preferable that the second heat treatment be performed at a temperature higher than the temperature of the first heat treatment and lower than the strain point of the supporting substrate 100. Alternatively, even if the first heat treatment and the second heat treatment are performed at the same temperature, it is preferable that the second heat treatment be performed for a longer period of treatment time.

The heat treatment may be performed so that the supporting substrate 100 and/or the LTSS layer 101 are/is heated by thermal conduction heating, convection heating, radiation heating, or the like. Through the second heat treatment, residual stress of the LTSS layer 101 can be relaxed, and the second heat treatment is also effective in recovering the damage of the LTSS layer 101 caused by division through the first heat treatment.

In the above-described manner, the SOI substrate shown in FIG. 2C is formed.

According to this embodiment mode, even if the supporting substrate 100 having an allowable temperature limit of 700° C. or lower such as a glass substrate is used, the LTSS layer 101 which has a strong bonding force in a bonding portion can be obtained. As the supporting substrate 100, it is possible to use any of a variety of glass substrates that are used in the electronics industry and that are referred to as non-alkali glass substrates, such as aluminosilicate glass substrates, aluminoborosilicate glass substrates, and barium borosilicate glass substrates. In other words, a single-crystal semiconductor layer can be formed over a substrate that is longer than one meter on each side. With the use of such a large-sized substrate, not only a display device such as a liquid crystal display but also a semiconductor integrated circuit can be manufactured.

Next, a semiconductor device formed using any of the above-described SOI structures and a method for manufacturing the semiconductor device are described with reference to FIGS. 9A to 9F, 10A to 10F, 11A to 11E, and 12A to 12E.

First, on the surface of a semiconductor substrate 106, a light-transmitting conductive film 141 is formed. In this embodiment mode, the light-transmitting conductive film 141 is formed using an indium-tin-oxide (ITO) film by a sputtering method using argon (Ar) and oxygen ($O_2$) as a deposition gas with a deposition pressure of 0.4 Pa at a thickness of 50 nm to 100 nm, specifically, 110 nm (see FIG. 9A).

Figure 9A:
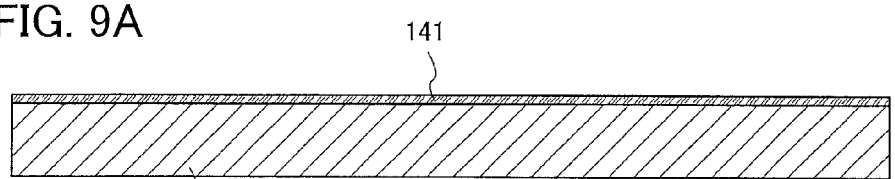
FIGS. 9A to 9F are cross-sectional views showing a method for manufacturing a semiconductor device using a substrate having an SOI substrate.
Figure 9B:
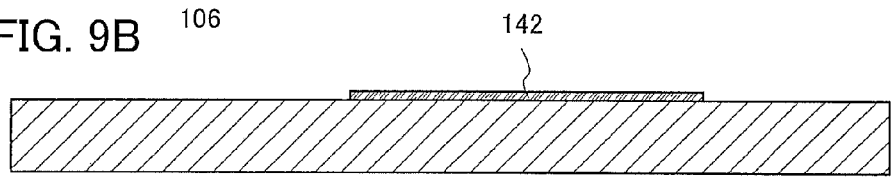

Next, the light-transmitting conductive film 141 is selectively removed to form a first pixel electrode 142 (see FIG. 9B). When an indium-tin-oxide film is used for the light-transmitting conductive film 141, it is formed into a desired shape by wet etching using an etchant which contains an oxalic acid as its main component. Furthermore, by heat treatment at 250° C. or higher, the indium-tin-oxide film is crystallized to have resistance to acid.

Note that, although an indium tin oxide is used for the light-transmitting conductive film 141 in this embodiment mode, instead of an indium tin oxide, another material which has a high etching selectivity with respect to silicon may be used.

Figure 9C:
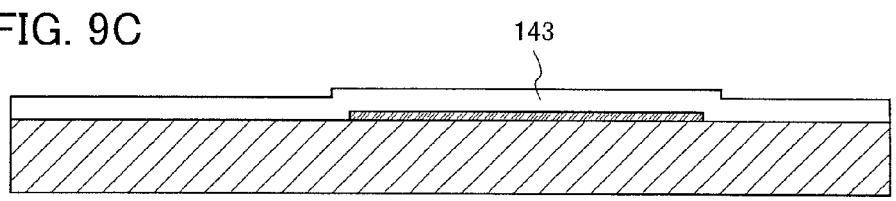
Figure 9D:
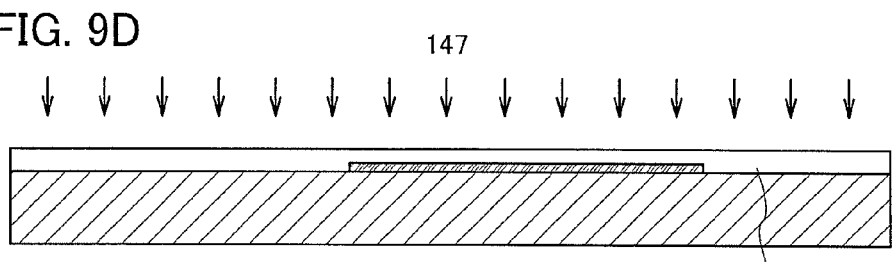

Next, an insulating film 143 is formed over the semiconductor substrate 106 and the first pixel electrode 142 (see FIG. 9C). In this embodiment mode, the insulating film 143 is formed using a stacked-layer film of a nitrogen-containing silicon oxide film with a thickness of 100 nm and an oxygen-containing silicon nitride film with a thickness of 300 nm.

In addition, the insulating film 143 is polished by chemical mechanical polishing (CMP), whereby an insulating film 145 with a smooth surface is obtained. Although the insulating film 143 has a step because the first pixel electrode 142 is formed therebelow, the step is eliminated by polishing.

Figure 9E:
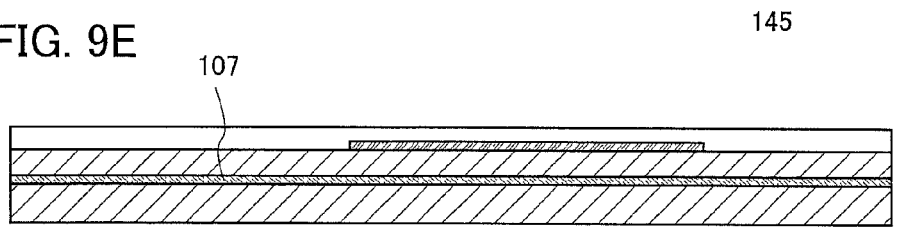
Figure 9F:
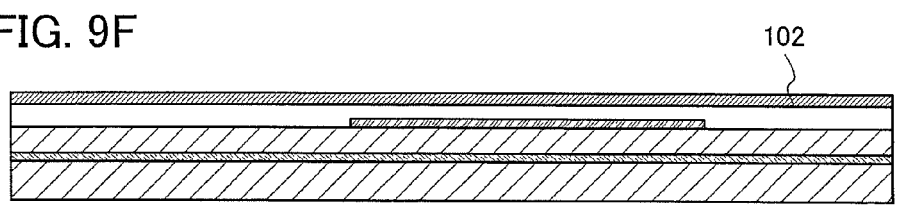

Furthermore, after the insulating film 145 is formed, hydrogen ions 147 are implanted (see FIG. 9D) to form a separation layer 107 (see FIG. 9E). In this embodiment mode, the hydrogen ions are implanted with an applied voltage of 80 keV and at a dose of $2.5 \times 10^{16}/cm^2$. Accordingly, the separation layer 107 is formed at a depth of 100 nm to 300 nm from the surface of the semiconductor substrate 106.

Next, over the insulating film 145, a bonding layer 102 is formed (see FIG. 9E). In this embodiment mode, a silicon oxide layer is formed as the bonding layer 102 by a CVD method. By use of tetraethylorthosilicate (also referred to as TEOS) as a deposition gas, surface planarity becomes favorable and yield at the time of a later bonding step becomes high.

Figure 10A:
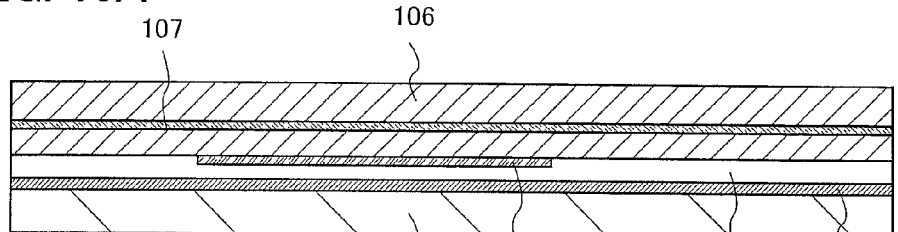
FIGS. 10A to 10F are cross-sectional views showing a method for manufacturing a semiconductor device using a substrate having an SOI structure.

After the structure shown in FIG. 9E is obtained, a supporting substrate 100 and the surface of the semiconductor substrate 106 where the bonding layer 102 is formed are made to face each other and located in contact with each other, thereby forming a bond (see FIG. 10A).

Note that, as shown in FIGS. 2B and 2C, the bonding layer 102 may be formed over not the semiconductor substrate 106 but the supporting substrate 100, or as shown in FIG. 1B, the bonding layer 102 may be formed over each of the semiconductor substrate 106 and the supporting substrate 100.

In addition, as shown in FIGS. 1B, 2B, and 2C, the supporting substrate 100 may be provided with a barrier layer 103. For example, as the barrier layer 103, a stacked layer of a silicon nitride layer and a silicon oxide layer may be formed. By the supporting substrate 100 being provided with a barrier layer, the contamination of an LTSS layer 101 can be prevented. Note that, in place of a silicon nitride layer, an oxygen-containing silicon nitride layer, an aluminum nitride layer, or an oxygen-containing aluminum nitride layer may be used.

First heat treatment is performed in a state where the semiconductor substrate 106 and the supporting substrate 100 are superposed on each other. As the first heat treatment, for example, the semiconductor substrate 106 and the supporting substrate 100 may be heated to 400° C. to 600° C. By the first heat treatment, separation of the semiconductor substrate 106 is performed while a thin semiconductor layer (LTSS layer) 101 is left remaining over the supporting substrate 100 (see FIG. 10B). By application of a force to each of the semiconductor substrate 106 and the supporting substrate 100 in a different direction, the LTSS layer 101 is formed over the supporting substrate.

Figure 10B:
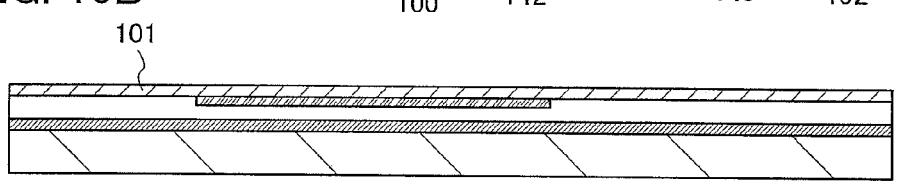

In the structure shown in FIG. 10B, the pixel electrode 142 is in a state of being embedded in the insulating film 145, and the LTSS layer 101 is formed over the pixel electrode 142 and the insulating film 145.

Next, the LTSS layer 101 is thinned to a desired thickness. Examples of thinning methods include a CMP method, an etching method, and the like. In this embodiment mode, the LTSS layer 101 is thinned by dry etching.

It is preferable that the thickness of the LTSS layer 101 be 5 nm to 500 nm, more preferably, 10 nm to 200 nm, still more preferably, 10 nm to 60 nm. The thickness of the LTSS layer 101 can be set appropriately by control of the depth at which the separation layer 107 is formed and depending on thinning conditions. In this embodiment mode, the LTSS layer is formed at a thickness of 50 nm by dry etching.

In order to control threshold voltage, a p-type impurity element such as boron, aluminum, or gallium is added to the LTSS layer 101. For example, boron may be added as a p-type impurity element at a concentration of $1 \times 10^{16}$ cm$^{-3}$ to $1 \times 10^{18}$ cm$^{-3}$.

Figure 10C:
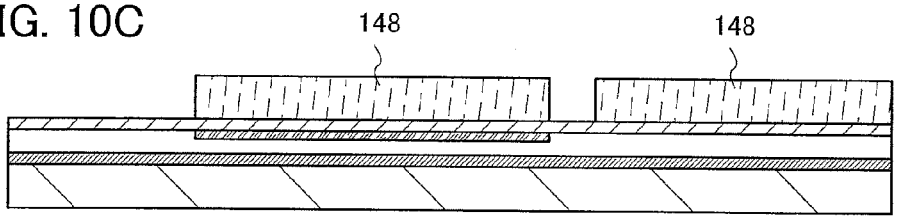
Figure 10D:
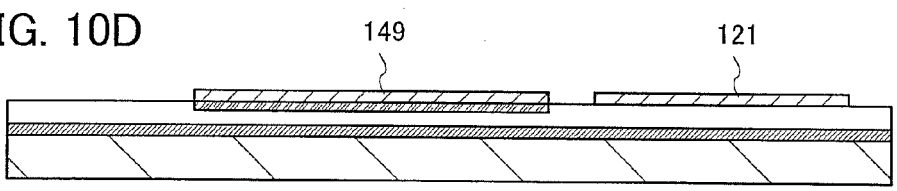

A mask 148 is formed over the LTSS layer 101, and the LTSS layer 101 is etched using the mask 148 (see FIG. 10C). An island-shaped single-crystal semiconductor layer 121, which is isolated in an island shape to match the location of an active layer, and a protective layer 149 for the pixel electrode 142 are formed (see FIG. 10D).

A surface where the island-shaped single-crystal semiconductor layer 121 formed in the above-described step is in contact with the insulating film 145 roughly coincides with a surface where the pixel electrode 142 is in contact with the protective layer 149.

Figure 10E:
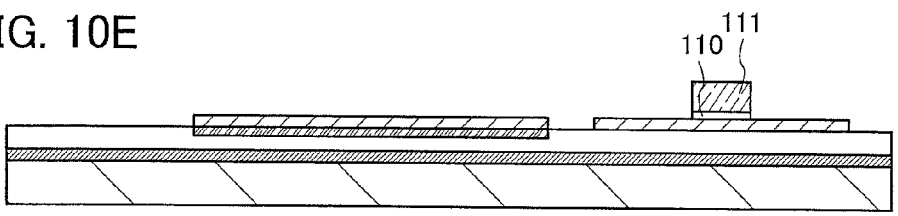

Then, over the island-shaped single-crystal semiconductor layer 121, a gate insulating film 110 and a gate electrode 111 are formed (see FIG. 10E). In this embodiment mode, the gate insulating film 110 and the gate electrode 111 are formed with the same width, but in order to form low-concentration impurity regions, the width of the gate insulating film 110 may be larger than that of the gate electrode 111. Alternatively, the gate insulating film 110 may be formed to cover the island-shaped single-crystal semiconductor layer 121 and the insulating film 145.

The gate insulating film 110 may be formed using any of a silicon oxide film, a silicon nitride film, a nitrogen-containing silicon oxide film, and an oxygen-containing silicon nitride film. In this embodiment mode, the gate insulating film 110 is formed using a silicon oxide film at a thickness of 10 nm to 100 nm.

The gate electrode 111 may be formed using tungsten (W), tantalum (Ta), titanium (Ti), aluminum (Al), or the like.

Figure 10F:
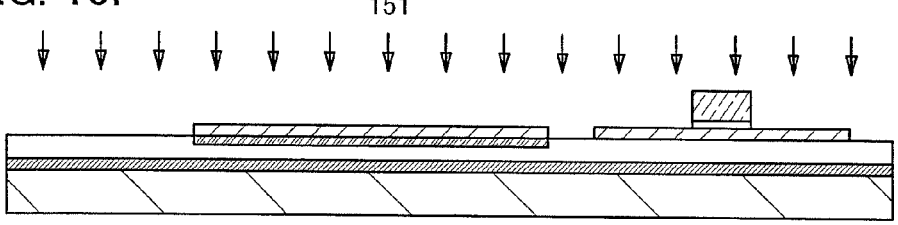

Next, with the use of the gate electrode 111 as a mask, an impurity element 151 which imparts one conductivity type is introduced into the island-shaped single-crystal semiconductor layer 121 (see FIG. 10F). At this time, the impurity element 151 is also added to the protective layer 149. When an impurity element which imparts n-type conductivity is used as the impurity element 151, examples of an impurity element which imparts n-type conductivity include phosphorus (P) and arsenic (As). When an impurity element which imparts p-type conductivity is used as the impurity element 151, an example of an impurity element which imparts p-type conductivity is boron (B).

By addition of the impurity element 151 which imparts one conductivity type, a channel formation region 161 is formed in a region below the gate electrode 111, and high-concentration impurity regions 162 which serve as a source region and a drain region (a high-concentration impurity region 162a and a high-concentration impurity region 162b) are formed in regions which are not covered by the gate electrode 111 and the gate insulating film 110.

In this embodiment mode, for example, phosphorus (P) is used as the impurity element 151 which imparts n-type conductivity and added with an applied voltage of 20 keV and at a dose of 1.0/cm$^2$. Accordingly, the high-concentration impurity regions 162 are made to each contain phosphorus at a concentration of $3 \times 10^{21}$/cm$^3$.

Figure 11A:
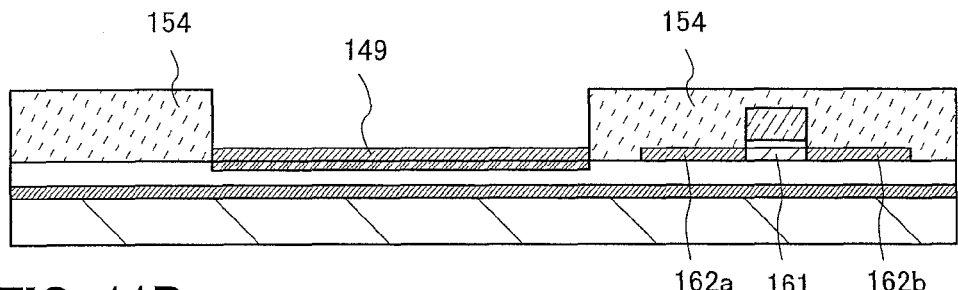
FIGS. 11A to 11E are cross-sectional views showing a method for manufacturing a semiconductor device using a substrate having an SOI structure.
Figure 11B:
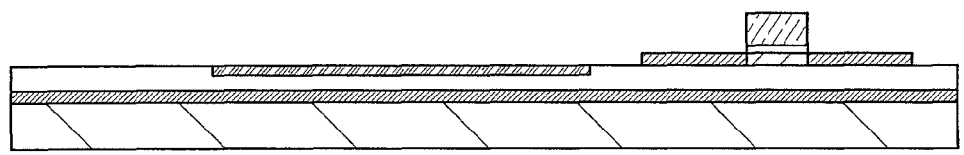
Figure 11C:
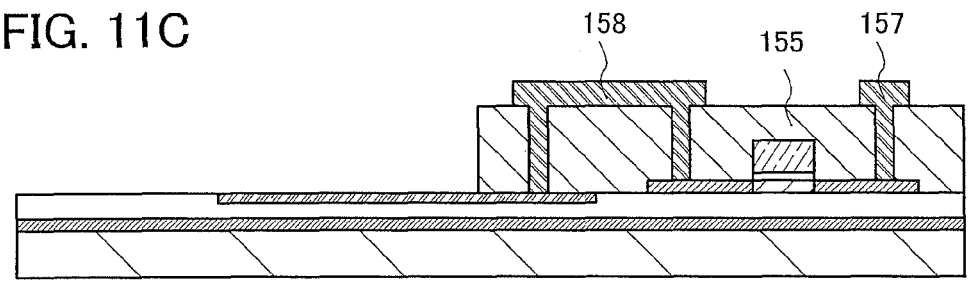
Figure 11D:
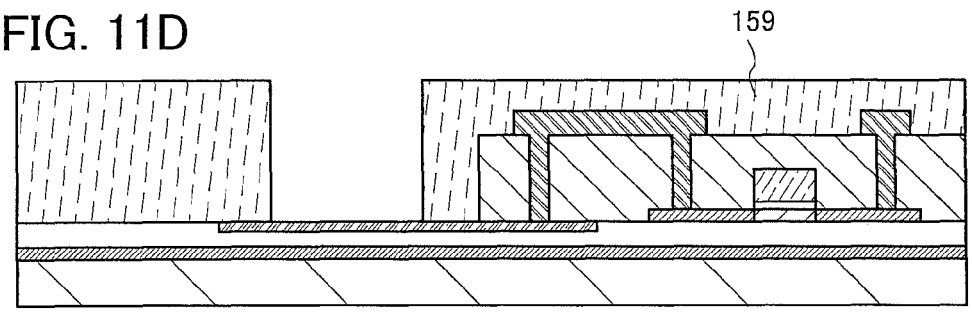

Next, a mask 154 is formed to cover a region other than the protective layer 149 over the pixel electrode 142 (see FIG. 11A), and the protective layer 149 is removed by etching to expose the pixel electrode 142 (see FIG. 11B). In the case where an indium tin oxide (ITO) is used as a material of the pixel electrode 142 and a single-crystal silicon layer is used as the protective layer 149, an ammonia hydrogen peroxide mixture may be used as an etchant. Because an ammonia hydrogen peroxide mixture has a high etching selectivity between silicon and ITO, the protective layer 149 is etched while the planarity at the interface between the single-crystal silicon layer and the indium tin oxide layer is maintained, and the indium tin oxide layer having a flat surface is exposed. Alternatively, instead of an ammonia hydrogen peroxide mixture, tetramethylammonium hydroxide (TMAH), which has a high etching selectivity between silicon and ITO, may be used.

Note that, in the manufacturing steps of FIGS. 10C to 11B, the LTSS layer 101 is selectively etched; the impurity element 151 which imparts one conductivity type is added; and the protective layer 149 over the pixel electrode 142 is removed. On the other hand, manufacturing steps in the case where the LTSS layer 101 is used as a protective layer for the pixel electrode 142 without being selectively etched are described with reference to FIGS. 12A to 12E. Note that, in FIGS. 12A to 12E, the same components as those in FIGS. 10C to 11B are denoted by the same reference numerals.

Figure 12A:
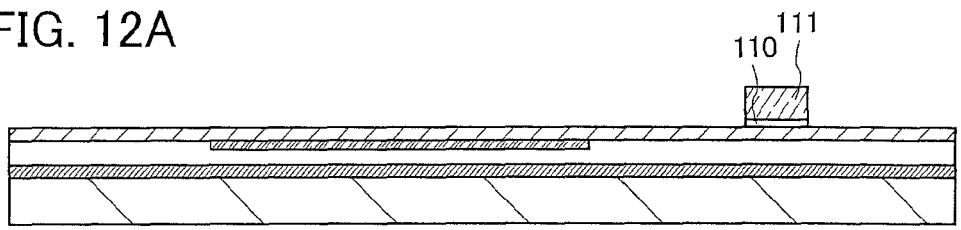
FIGS. 12A to 12E are cross-sectional views showing a method for manufacturing a semiconductor device using a substrate having an SOI structure.

After the structure shown in FIG. 10B is formed, a gate insulating film 110 and a gate electrode 111 are formed over a region of the LTSS layer 101 which serves as an active layer (see FIG. 12A).

Figure 12B:
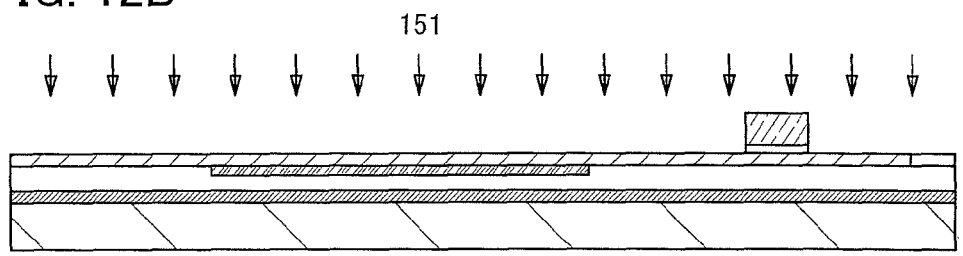
Figure 12C:
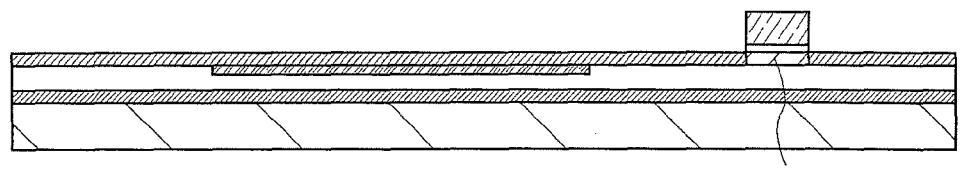

Next, an impurity element 151 which imparts one conductivity type is added to the LTSS layer 101 (see FIG. 12B). Accordingly, in a region of the LTSS layer 101 which is covered by the gate electrode 111, a channel formation region 161 is formed without the impurity element 151 being added thereto (see FIG. 12C).

Figure 12D:
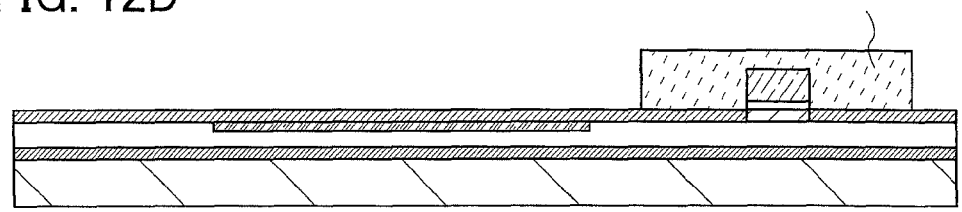

Furthermore, over the region of the LTSS layer 101 which serves as an active layer, a mask 154 is formed, and the LTSS layer 101 is etched (see FIG. 12D). Accordingly, an active layer is formed, which includes high-concentration impurity regions 162, which serve as a source region and a drain region (a high-concentration impurity region 162a and a high-concentration impurity region 162b), and a channel formation region 161 (see FIG. 12E). Note that FIG. 12E and FIG. 11B show the same structure.

Figure 12E:
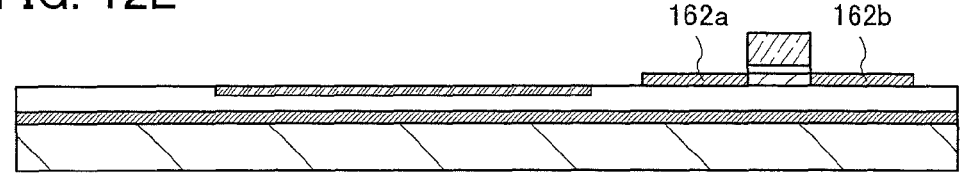

After the manufacturing steps up to that shown in FIG. 11B or 12E are performed, an interlayer insulating film 155 is formed. The interlayer insulating film 155 is formed of a borophosphosilicate glass (BPSG) film or formed by coating with an organic resin typified by polyimide. Contact holes are formed in the interlayer insulating film 155, and a wiring 157 and a wiring 158 are formed to match the contact holes (see FIG. 11C). The wiring 157 is electrically connected to the high-concentration impurity region 162b, and the wiring 158 is electrically connected to the high-concentration impurity region 162a and to the pixel electrode 142.

The wirings 157 and 158 may be formed using a material having low contact resistance to the island-shaped single-crystal semiconductor layer 121, which is an active layer, and with the pixel electrode 142. In this embodiment mode, the wirings 157 and 158 are formed using aluminum or an aluminum alloy. An upper layer and a lower layer thereof may be formed as barrier metal using metal films of molybdenum, chromium, titanium, or the like.

Next, an insulating film is formed to cover the insulating film 145, the interlayer insulating film 155, and the wirings 157 and 158, and then, a region over the pixel electrode 142 is exposed. Alternatively, an insulating film having an opening in a region over the pixel electrode 142 is formed. Such an insulating film is formed as a partition 159 (see FIG. 11D). As a material of the partition 159, an organic resin material or an inorganic resin material may be used.

Next, in a region which is over the pixel electrode 142 and surrounded by the partition 159, a light-emitting layer 181 is formed. The light-emitting layer 181 may be formed using an organic compound or an inorganic compound.

For the light-emitting layer 181 of an organic compound, materials described below can be used. For example, as a light-emitting material which exhibits red light emission, a material such as $Alq_3$:DCM or $Alq_3$:rubrene:BisDCJTM is used. As a light-emitting material which exhibits green light emission, a material such as $Alq_3$:DMQD (N,N'-dimethylquinacridon) or $Alq_3$:coumarin 6 is used. As a light-emitting material which exhibits blue light emission, a material such as α-NPD or tBu-DNA is used.

Inorganic EL elements using an inorganic compound as a light-emitting material are classified into a dispersion type inorganic EL element and a thin-film type inorganic EL element, depending on their element structures. The former and the latter are different in that the former has an electroluminescent layer where particles of a light-emitting material are dispersed in a binder whereas the latter has an electroluminescent layer formed of a thin film of a light-emitting material. However, the former and the latter have in common that electrons accelerated by a high electric field are necessary. Note that, as a mechanism of light emission to be obtained, there are donor-acceptor recombination type light emission that utilizes a donor level and an acceptor level, and localized type light emission that utilizes inner-shell electron transition of a metal ion. In general, in many cases, a dispersion-type inorganic EL element generates donor-acceptor recombination type light emission, and a thin-film type inorganic EL element generates localized type light emission.

A light-emitting material that can be used in the present invention includes a base material and an impurity element which serves as a light-emission center. By changing impurity elements to be included, various colors of light emission can be performed. As a method for forming the light-emitting material, any of various methods such as a solid phase method and a liquid phase method (a coprecipitation method) can be used. Further, an evaporative decomposition method, a double decomposition method, a method by heat decomposition reaction of a precursor, a reversed micelle method, a method in which such a method is combined with high-temperature baking, a liquid phase method such as a lyophilization method, or the like can also be used.

A solid phase method is a method in which a base material, and an impurity element or a compound containing an impurity element are weighed, mixed in a mortar, heated in an electric furnace, and baked to be reacted, whereby the impurity element is contained in the base material. The baking temperature is preferably 700° C. to 1500° C. This is because solid-phase reaction does not progress when the temperature is too low, whereas the base material is decomposed when the temperature is too high. The baking may be performed in a powder state; however, it is preferable to perform the baking in a pellet state. Although the baking needs to be performed at relatively high temperature, the solid phase method is easy; thus, the solid phase method has high productivity and is suitable for mass production.

A liquid phase method (coprecipitation method) is a method in which a base material or a compound containing a base material is reacted with an impurity element or a compound containing an impurity element in a solution, dried, and then baked. Particles of a light-emitting material are distributed uniformly, and the reaction can progress even when the grain size is small and the baking temperature is low.

As a base material used for a light-emitting material, a sulfide, an oxide, or a nitride can be used. Examples of sulfides are zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), and the like. Examples of oxides are zinc oxide (ZnO), yttrium oxide ($Y_2O_3$), and the like. Examples of nitrides are aluminum nitride (AlN), gallium nitride (GaN), indium nitride (InN), and the like. Other examples are zinc selenide (ZnSe), zinc telluride (ZnTe), and the like, and ternary mixed crystals such as calcium-gallium sulfide ($CaGa_2S_4$), strontium-gallium sulfide ($SrGa_2S_4$), and barium-gallium sulfide ($BaGa_2S_4$).

As a light-emission center of localized type light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added as charge compensation.

On the other hand, as a light-emission center of donor-acceptor recombination type light emission, a light-emitting material that includes a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case where a light-emitting material for donor-acceptor recombination type light emission is synthesized by a solid phase method, the base material, the first impurity element or a compound containing the first impurity element, and the second impurity element or a compound containing the second impurity element are each weighed, mixed in a mortar, heated in an electric furnace, and baked. As the base material, any of the above-described base materials can be used. As the first impurity element or the compound containing the first impurity element, for example, fluorine (F), chlorine (Cl), aluminum sulfide ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. The baking temperature is preferably 700° C. to 1500° C. This is because solid-phase reaction does not progress when the temperature is too low, whereas the base material is decomposed when the temperature is too high. Note that, although the baking may be performed in a powder state, it is preferable to perform the baking in a pellet state.

As the impurity element in the case of utilizing solid-phase reaction, a compound of the first impurity element and the second impurity element may be used. In this case, since the impurity element is easily diffused and solid-phase reaction progresses easily, a uniform light-emitting material can be obtained. Further, since an unnecessary impurity element is not mixed, a light-emitting material having high purity can be obtained. As the compound of the first impurity element and the second impurity element, for example, copper chloride (CuCl), silver chloride (AgCl), or the like can be used.

Note that the concentration of each impurity element may be 0.01 at. % to 10 at. % with respect to the base material, and is preferably 0.05 at. % to 5 at. %.

In the case of a thin-film type inorganic EL element, a light-emitting layer is a layer containing the above-mentioned light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

A surface where the pixel electrode 142 is in contact with the light-emitting layer 181 coincides with a surface where the pixel electrode 142 is in contact with the protective layer 149. Therefore, the surface where the pixel electrode 142 is in contact with the light-emitting layer 181 roughly coincides with a surface where the island-shaped single-crystal semiconductor layer 121 is in contact with the insulating film 145.

Figure 11E:
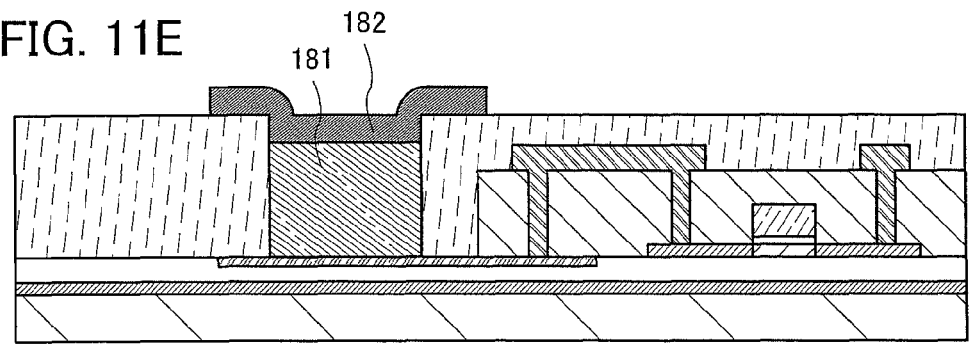

Next, over the light-emitting layer 181 and the partition 159, a second pixel electrode 182 which is electrically connected to the light-emitting layer 181 is formed (see FIG. 11E). The pixel electrode 182 is formed using a light-transmitting conductive film, and may be formed using the same material as that of the pixel electrode 142 or using a different material. Because the pixel electrode 142 and the pixel electrode 182 are each formed using a light-transmitting conductive film, a light-emitting device of this embodiment mode is a dual-emission light-emitting device.

In the above-described manner, a light-emitting device using the present invention is manufactured. The pixel electrode 142 can maintain its surface planarity because the surface thereof in contact with the semiconductor substrate 106 formed of a single-crystal is also to be in contact with the light-emitting layer 181. Accordingly, point defects can be prevented and a light-emitting device with high reliability can be obtained.

Furthermore, a TFT can be manufactured using the LTSS layer 101, which is bonded to the supporting substrate 100, as an active layer. The LTSS layer 101 used as an active layer is a single-crystal semiconductor with uniform crystal orientation; thus, a TFT capable of high-speed drive can be obtained.

In accordance with this embodiment mode described above, a semiconductor device with high drive speed as well as high reliability can be obtained.

[Embodiment Mode 2]

In Embodiment Mode 1, the light-transmitting conductive film 141 is used for the pixel electrode 142; however, a reflective conductive film may be used as the pixel electrode 142. Alternatively, the pixel electrode 142 may be formed using the light-transmitting conductive film 141 and a reflective conductive film may be formed over the pixel electrode 142.

Light-emitting devices of this embodiment mode are described with reference to FIGS. 13A to 13C. Note that the same components as those in Embodiment Mode 1 are denoted by the same reference numerals.

Figure 13A:
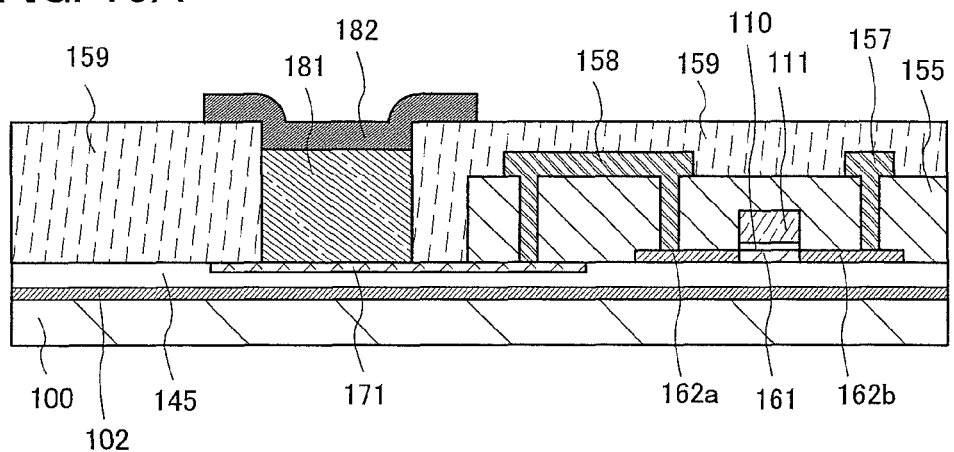
FIGS. 13A to 13C are cross-sectional views of semiconductor devices each using a substrate having an SOI structure.

In a light-emitting device shown in FIG. 13A, instead of the pixel electrode 142, a pixel electrode 171 is formed using a reflective conductive film. For the reflective conductive film, titanium, molybdenum, tungsten, silver, tantalum, or the like may be used.

Light-emitting devices in which the pixel electrode 142 is formed using the light-transmitting conductive film 141 and a reflective conductive film is formed over the pixel electrode 142 are described with reference to FIGS. 13B and 13C.

Figure 13B:
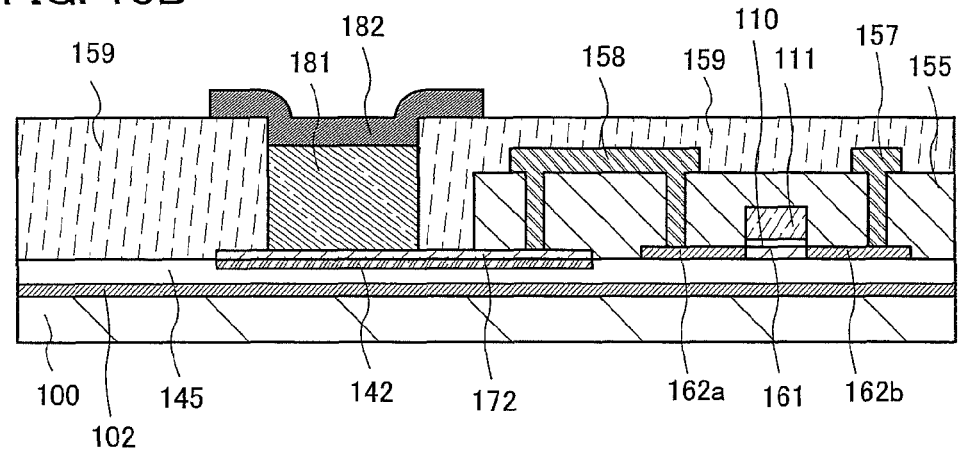
Figure 13C:
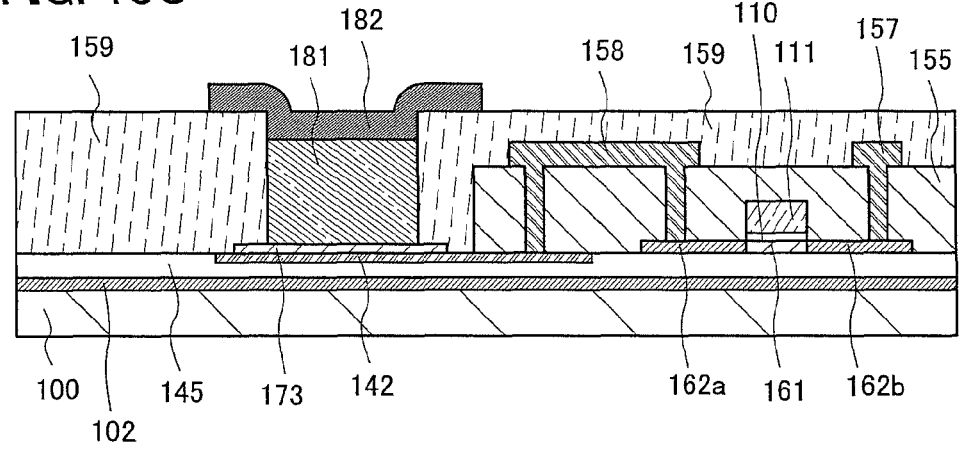

In the light-emitting device shown in FIG. 13B, after the structure shown in FIG. 11B of Embodiment Mode 1 is formed and before the interlayer insulating film 155 is formed, a pixel electrode 172 is formed using a reflective conductive film. In the light-emitting device shown in FIG. 13C, after the structure shown in FIG. 11C of Embodiment Mode 1 is formed and before the partition 159 is formed, a pixel electrode 173 is formed using a reflective conductive film.

According to this embodiment mode, a semiconductor device with high reliability and high drive speed can be obtained. Note that a top surface of the pixel electrode and a bottom surface of the island-shaped single-crystal semiconductor layer are roughly coplanar. Or, a difference between a height of a top surface of the pixel electrode and a height of a bottom surface of the island-shaped single-crystal semiconductor layer is shorter than a film thickness of the pixel electrode, that is, 100 nm or less, because a part of the pixel electrode may be removed in etching.

[Embodiment Mode 3]

In this embodiment mode, examples of structures of an EL module and an EL television receiver using the display device of the present invention are described with reference to FIGS. 14 to 16.

Figure 14:
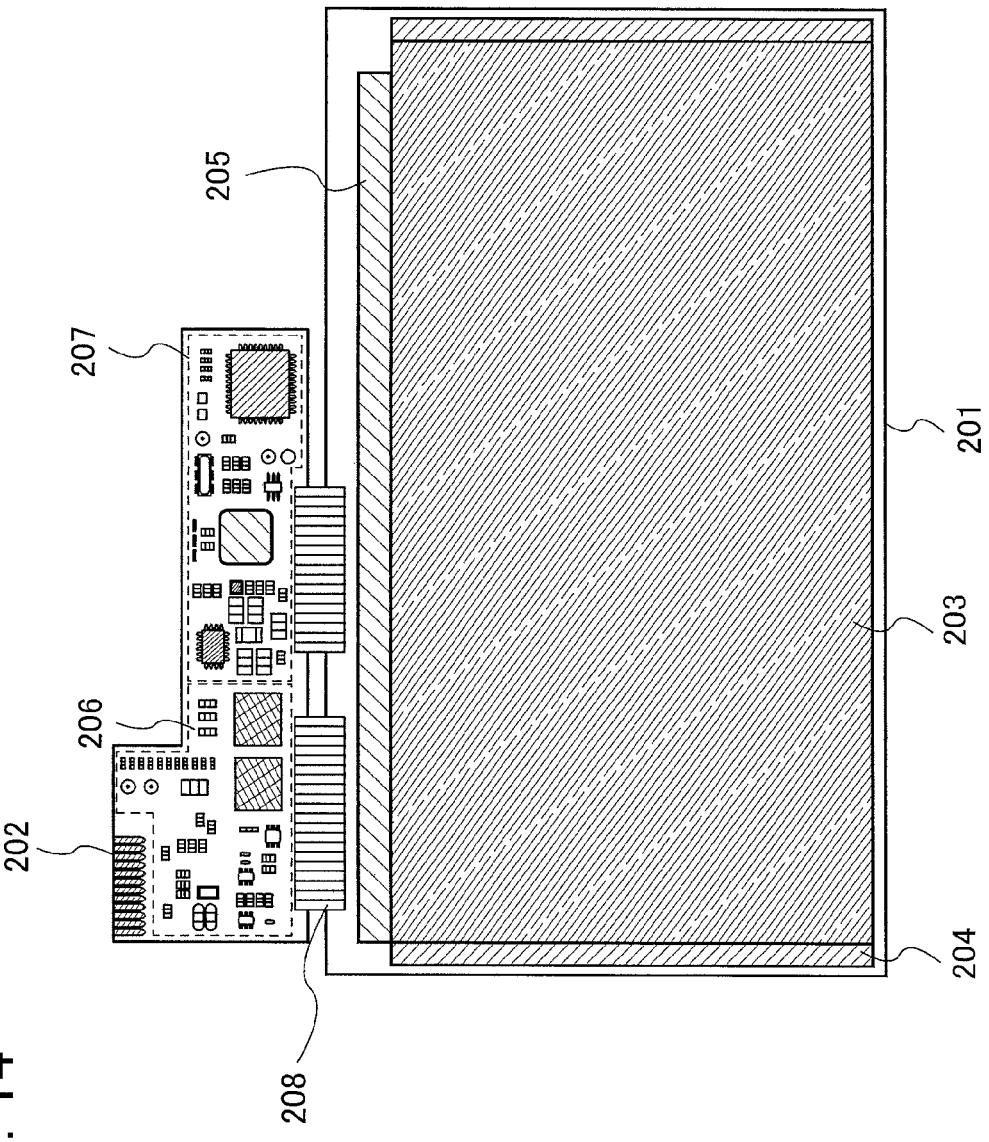
FIG. 14 is a diagram showing an EL module of the present invention.

FIG. 14 shows an EL module in which a display panel 201 and a circuit board 202 are combined with each other. The display panel 201 has a pixel portion 203, a scan line driver circuit 204, and a signal line driver circuit 205. Over the circuit board 202, for example, a control circuit 206, a signal dividing circuit 207, and the like are formed. The display panel 201 and the circuit board 202 are connected to each other by a connection wiring 208. As the connection wiring, an FPC or the like can be used.

In the display panel 201, the pixel portion 203 and some of peripheral driver circuits (driver circuits with low operation frequency of a plurality of driver circuits) are formed over the same substrate using transistors. Any of the light-emitting devices manufactured using Embodiment Modes 1 and 2 may be used as the pixel portion 203.

Some of peripheral driver circuits (driver circuits with high operation frequency of the plurality of driver circuits) may be formed on an IC chip, and the IC chip may be mounted on the display panel 201 by chip on glass (COG) or the like. Alternatively, the IC chip may be mounted on the display panel 201 by tape automated bonding (TAB) or by using a printed board.

In addition, by impedance conversion of a signal set to a scan line or a signal line by a buffer circuit, the length of a writing period for pixels of each row can be reduced. Thus, a high-definition display device can be provided.

In order to further reduce power consumption, a pixel portion may be formed using transistors over a glass substrate, and all signal line driver circuits may be formed on an IC chip, and the IC chip may be mounted on a display panel by chip on glass (COG).

For example, the entire screen of the display panel may be divided into several regions, and an IC chip in which some of or all of peripheral driver circuits (the signal line driver circuit, the scan line driver circuit, and the like) are formed may be arranged in each region and mounted on the display panel by chip on glass (COG) or the like.

Figure 15:
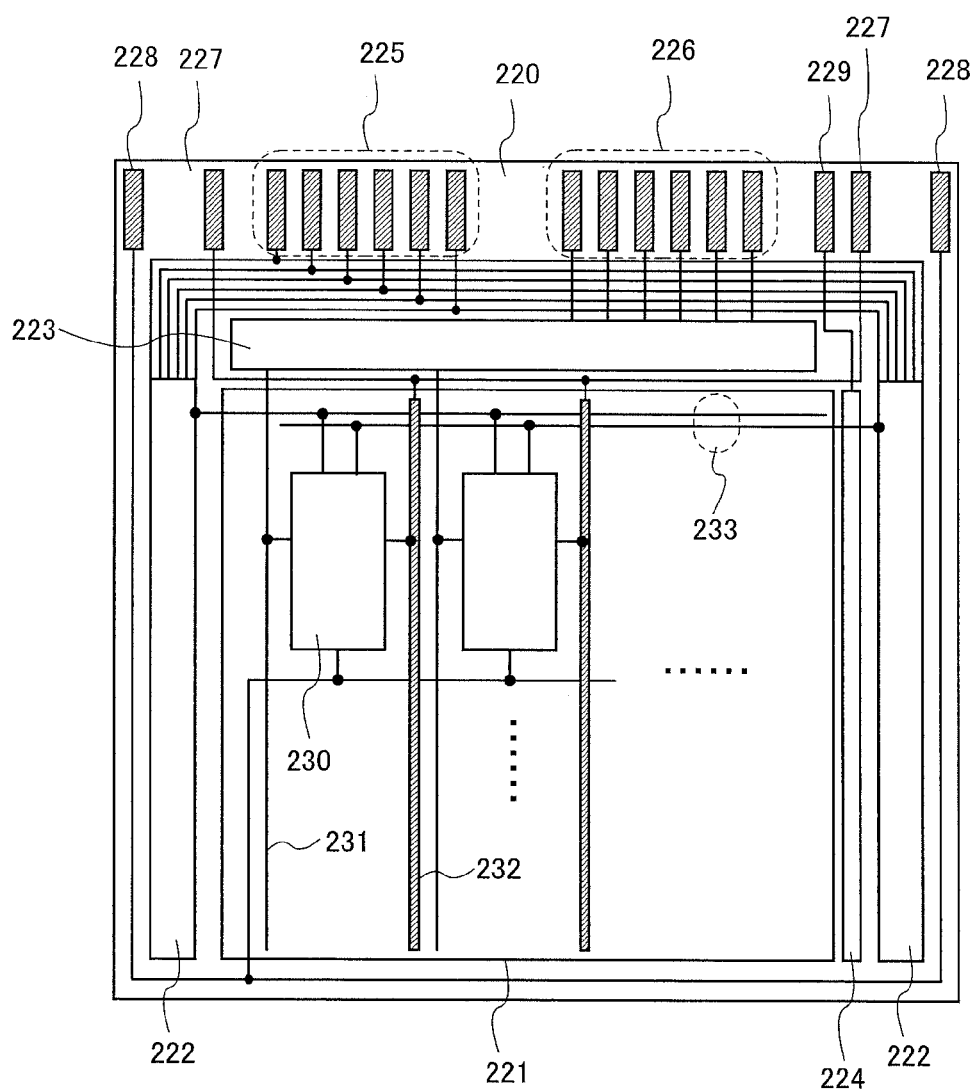
FIG. 15 is a diagram showing a display panel of the present invention.
Figure 16:
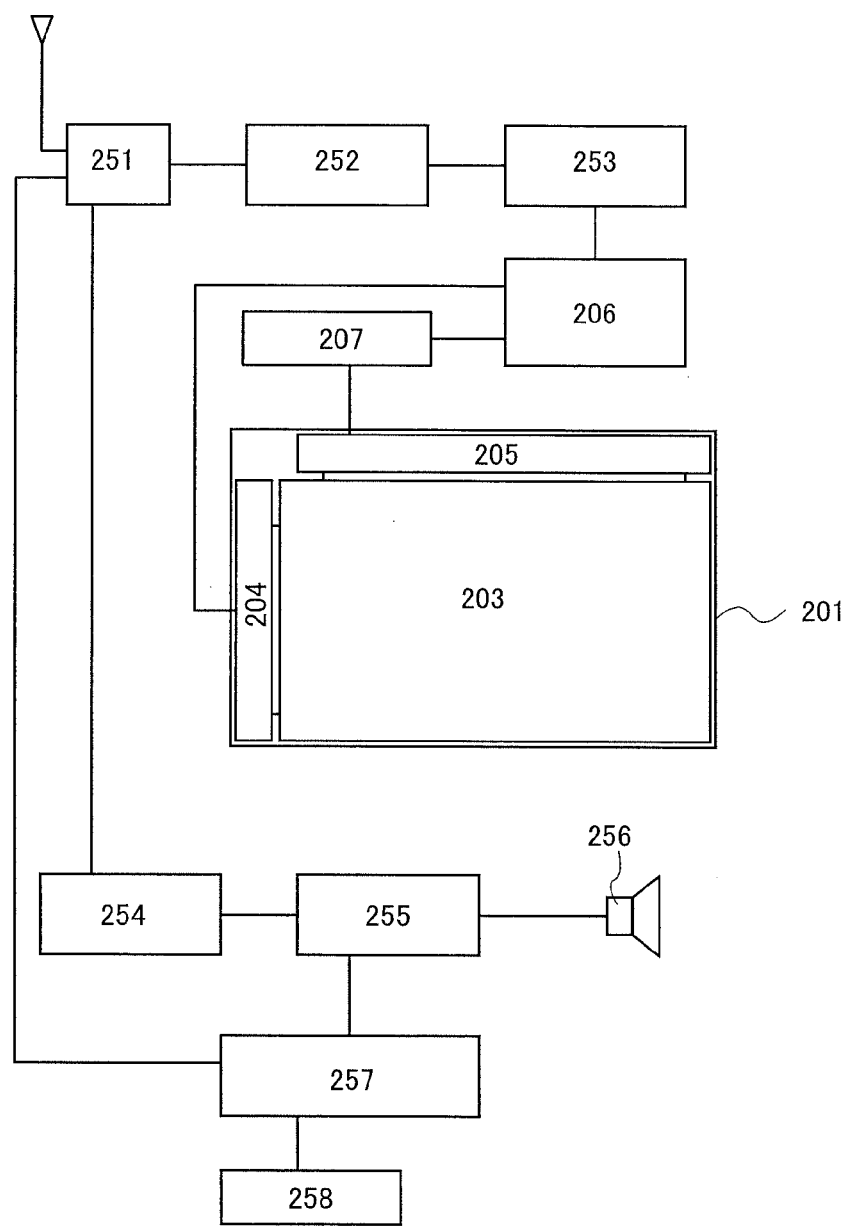
FIG. 16 is a block diagram showing main components of an EL television receiver of the present invention.

FIG. 15 shows an example of a display panel having another structure. The display panel of FIG. 15 has a pixel portion 221 in which a plurality of pixels 230 is arranged, a scan line driver circuit 222 which controls a signal of a scan line 233, and a signal line driver circuit 223 which controls a signal of a signal line 231, over a substrate 220. In addition, the display panel may be provided with a monitor circuit 224 for correcting changes in the luminance of light-emitting elements included in the pixels 230. The light-emitting elements included in the pixels 230 and a light-emitting element included in the monitor circuit 224 have the same structure. The light-emitting elements each have a structure where a layer including a material which exhibits electroluminescence is interposed between a pair of electrodes.

The peripheral portion of the substrate 220 has an input terminal 225 through which a signal is input to the scan line driver circuit 222 from an external circuit, an input terminal 226 through which a signal is input to the signal line driver circuit 223 from an external circuit, and an input terminal 229 through which a signal is input to the monitor circuit 224.

For the light-emitting element included in the pixel 230 to emit light, a power supply from an external circuit is necessary. A power supply line 232 provided in the pixel portion 221 is connected to an external circuit through an input terminal 227. Resistance loss occurs in the power supply line 232 depending on the length to be led out; thus, a plurality of input terminals 227 is preferably provided in the peripheral portion of the substrate 220. The input terminals 227 are provided on opposite ends of the substrate 220 and arranged so that luminance unevenness is inconspicuous at the surface of the pixel portion 221. In other words, display in which one side of the screen is bright while the other side remains dark is prevented from occurring. In addition, an electrode, which is one of a pair of electrodes included in the light-emitting element, on the side opposite to the electrode connected to the power supply line 232 is formed as a common electrode which is shared among the plurality of pixels 230. Further, a plurality of terminals 228 is provided to reduce resistance loss in the electrode.

In such a display panel, a power supply line is formed using a low resistance material such as Cu, which is especially effective when a screen size is increased. For example, when a screen size is 13 inches, the length of a diagonal line is 340 mm, while 1500 mm or more for 60 inches. In such a case, because wiring resistance cannot be ignored, it is preferable that a low resistance material such as Cu be used for a wiring. In addition, in consideration of wiring delay, a signal line or a scan line may be formed in a similar manner.

With such an EL module having the panel structure as described above, an EL television receiver can be completed. FIG. 16 is a block diagram showing main components of an EL television receiver. A tuner 251 receives video signals and audio signals. The video signals are processed by a video signal amplifier circuit 252; a video signal processing circuit 253 for converting a signal output from the video signal amplifier circuit 252 into a color signal corresponding to each color of red, green, and blue; and a control circuit 206 for converting the video signal to be input to a driver circuit. The control circuit 206 outputs a signal to each of the scan line side and the signal line side. When digital drive is performed, a signal dividing circuit 207 may be provided on the signal line side to divide an input digital signal into M signals before the signals are supplied.

Among the signals received by the tuner 251, the audio signals are transmitted to an audio signal amplifier circuit 254, and an output thereof is supplied to a speaker 256 through an audio signal processing circuit 255. A control circuit 257 receives control data on a receiving station (reception frequency) or sound volume from an input portion 258 and transmits signals to the tuner 251 and the audio signal processing circuit 255.

By incorporating the EL module into a housing, a television receiver can be completed. A display portion is formed using the EL module. In addition, a speaker, a video input terminal, and the like are provided as appropriate.

Needless to say, the present invention is not limited to a television receiver, and can be applied to various applications, particularly as a large-area display medium such as an information display board at the train station or airport or an advertising display board on the street, in addition to a monitor of a personal computer.

[Embodiment Mode 4]

Examples of electronic devices using the display device of the present invention are as follows: cameras such as video cameras and digital cameras, goggle-type displays (head-mounted displays), navigation systems, sound reproducing devices (car audio systems, audio components, and the like), notebook personal computers, game machines, portable information terminals (mobile computers, cellular phones, portable game machines, electronic books, and the like), image reproducing devices provided with recording media (specifically, devices capable of reproducing recording media such as digital versatile discs (DVDs) and displaying images thereof), and the like. Specific examples of electronic devices are shown in FIGS. 17A to 17H.

Figure 17A:
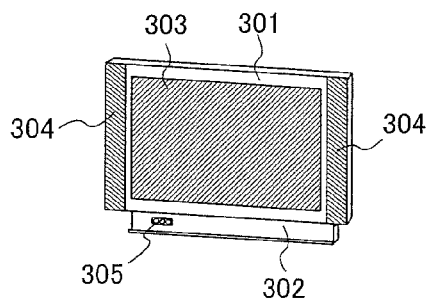
FIGS. 17A to 17H are diagrams showing examples of electronic devices manufactured using the present invention.

FIG. 17A shows a self-light emitting display, which has a housing 301, a supporting base 302, a display portion 303, speaker portions 304, a video input terminal 305, and the like. The present invention can be used for a display device included in the display portion 303. According to the present invention, a clear image can be displayed with reduced pseudo contour. A backlight is unnecessary because the display is of a self-light emitting type; thus, the display portion can be made to be thinner than that of a liquid crystal display. Note that the display includes all display devices for information display, for example, for a personal computer, for TV broadcast reception, for advertisement display, and the like.

Figure 17B:
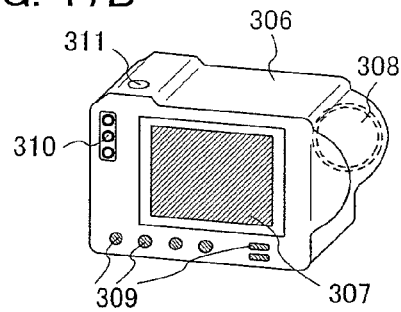

FIG. 17B shows a digital still camera, which has a main body 306, a display portion 307, an image receiving portion 308, operation keys 309, an external connection port 310, a shutter button 311, and the like. The present invention can be used for a display device included in the display portion 307.

Figure 17C:
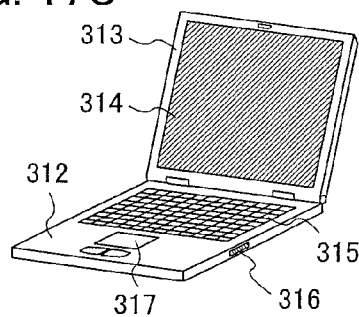

FIG. 17C shows a notebook personal computer, which has a main body 312, a housing 313, a display portion 314, a keyboard 315, an external connection port 316, a pointing device 317, and the like. The present invention can be used for a display device included in the display portion 314.

Figure 17D:
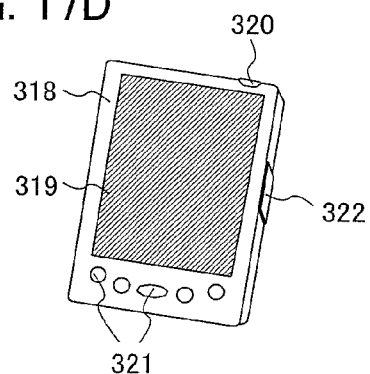

FIG. 17D shows a mobile computer, which includes a main body 318, a display portion 319, a switch 320, operation keys 321, an infrared port 322, and the like. The present invention can be used for a display device included in the display portion 319.

Figure 17E:
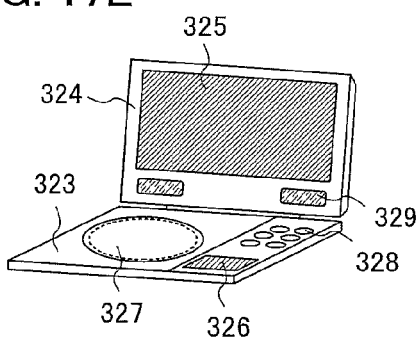

FIG. 17E shows an image reproducing device provided with a recording medium reading portion (specifically, a DVD reproducing device, for example), which has a main body 323, a housing 324, a display portion A 325, a display portion B 326, a recording medium reading portion 327 which reads a recording medium such as DVD, an operation key 328, a speaker portion 329, and the like. The display portion A 325 mainly displays image information, and the display portion B 326 mainly displays text information. The present invention can be used for display devices included in the display portion A 325 and the display portion B 326. Note that the image reproducing device provided with a recording medium includes a home-use game machine and the like.

Figure 17F:
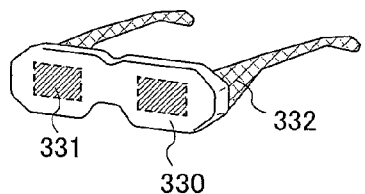

FIG. 17F shows a goggle-type display (head-mounted display), which has a main body 330, a display portion 331, an arm portion 332, and the like. The present invention can be used for a display device included in the display portion 331.

Figure 17G:
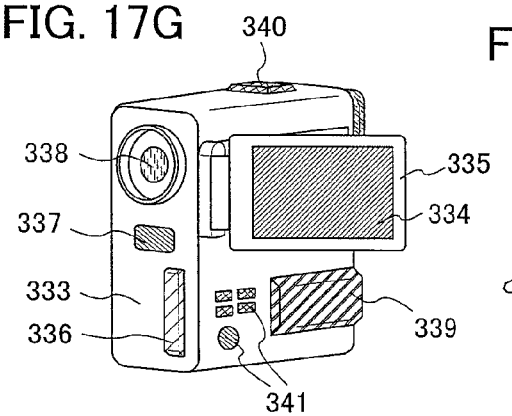

FIG. 17G shows a video camera, which has a main body 333, a display portion 334, a housing 335, an external connection port 336, a remote control receiving portion 337, an image receiving portion 338, a battery 339, an audio input portion 340, operation keys 341, and the like. The present invention can be used for a display device included in the display portion 334.

Figure 17H:
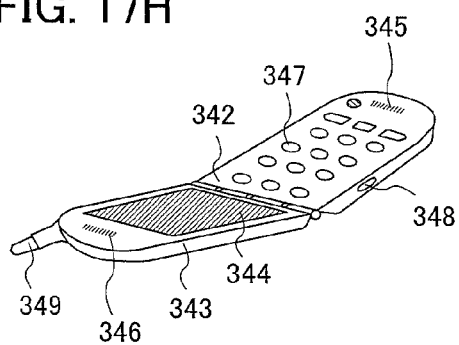

FIG. 17H shows a cellular phone, which has a main body 342, a housing 343, a display portion 344, an audio input portion 345, an audio output portion 346, operation keys 347, an external connection port 348, an antenna 349, and the like. The present invention can be used for a display device included in the display portion 344.

Note that when a light-emitting material capable of exhibiting high luminance is used, the present invention can be applied to a front or rear projector which magnifies and projects light including output image information with a lens or the like.

Moreover, in recent years, the above-described electronic devices have often been used for displaying information distributed through electronic communication lines such as the Internet or CATV (cable TV), and in particular, opportunity to display moving image information has been increased. Because the light-emitting material has extremely high response speed, the light-emitting device is suitable for displaying moving images.

Furthermore, because a light-emitting display device consumes power in its light-emitting portion, it is preferable that information is displayed so that a light-emitting portion becomes as small as possible. Accordingly, when a light-emitting display device is used for a display portion of a portable information terminal which mainly displays text information, particularly a cellular phone and a sound reproducing device, it is preferable that the light-emitting display device be driven in such a manner that text information is displayed with a light-emitting portion while a non-light-emitting portion is used as a background.

As described above, the application range of the present invention is so wide that the present invention can be applied to electronic devices of various fields. In addition, for the electronic devices of this embodiment mode, any of the display devices having the structures described in Embodiment Modes 1 to 3 may be used. This application is based on Japanese Patent Application serial no. 2007-157063 filed with Japan Patent Office on Jun. 14, 2007, the entire contents of which are hereby incorporated by reference.

What is claimed is:
1. A semiconductor device comprising:
a bonding layer over a substrate; an insulating film and a first pixel electrode, which is embedded in the insulating film, over the bonding layer;
an island-shaped single-crystal semiconductor layer over the insulating film;
a channel formation region and high-concentration impurity regions in the island-shaped single-crystal semiconductor layer;
a gate insulating film and a gate electrode over the island-shaped single-crystal semiconductor layer;
an interlayer insulating film which covers the island-shaped single-crystal semiconductor layer, the gate insulating film, and the gate electrode;
a wiring which electrically connects one of the high-concentration impurity regions and the first pixel electrode to each other over the interlayer insulating film;
a partition which covers the interlayer insulating film, the island-shaped single-crystal semiconductor layer, the gate insulating film, and the gate electrode and has an opening in a region over the first pixel electrode;
a light-emitting layer in a region which is over the first pixel electrode and surrounded by the partition; and
a second pixel electrode which is electrically connected to the light-emitting layer over the light-emitting layer and the partition,
wherein a surface of the first pixel electrode, which is in contact with the light-emitting layer, is flat, and
wherein a surface where the insulating film is in contact with the island-shaped single-crystal semiconductor layer roughly coincides with a surface where the first pixel electrode is in contact with the light-emitting layer.

2. The semiconductor device according to claim 1, wherein the island-shaped single-crystal semiconductor layer is an island-shaped single-crystal silicon layer.

3. The semiconductor device according to claim 1, wherein the bonding layer comprises silicon oxide.

4. The semiconductor device according to claim 1, wherein the first pixel electrode comprises a light-transmitting conductive film.

5. The semiconductor device according to claim 1, wherein the first pixel electrode comprises a reflective conductive film.

6. The semiconductor device according to claim 1,
wherein a difference between a height of a top surface of the first pixel electrode and a height of a bottom surface of the island-shaped single-crystal semiconductor layer is 100 nm or less.

7. A semiconductor device comprising:
a bonding layer over a substrate;

an insulating film having a first opening over the bonding layer;

a first pixel electrode formed in the first opening;

a single-crystal semiconductor layer comprising a channel formation region and high-concentration impurity regions over the insulating film;

a gate insulating film and a gate electrode over the single-crystal semiconductor layer;

an interlayer insulating film which covers the single-crystal semiconductor layer, the gate insulating film, and the gate electrode;

a wiring which electrically connects one of the high-concentration impurity regions and the first pixel electrode to each other;

a partition which covers the interlayer insulating film and a part of the first pixel electrode, the partition having a second opening over a part of the first pixel electrode;

a light-emitting layer in the second opening; and a second pixel electrode which is electrically connected to the light-emitting layer over the light-emitting layer and the partition.

8. The semiconductor device according to claim 7, wherein the single-crystal semiconductor layer is a single-crystal silicon layer.

9. The semiconductor device according to claim 7, wherein the bonding layer comprises silicon oxide.

10. The semiconductor device according to claim 7, wherein the first pixel electrode comprises a light-transmitting conductive film.

11. The semiconductor device according to claim 7, wherein the first pixel electrode comprises a reflective conductive film.

12. The semiconductor device according to claim 7, wherein a top surface of the first pixel electrode is leveled.

13. The semiconductor device according to claim 7, wherein a top surface of the first pixel electrode and a bottom surface of the single-crystal semiconductor layer are coplanar.

14. A semiconductor device comprising:
a bonding layer over a substrate;
an insulating film having a first opening over the bonding layer;
a first pixel electrode formed in the first opening; a single-crystal semiconductor layer comprising a channel formation region and high-concentration impurity regions over the insulating film;

a gate insulating film and a gate electrode over the single-crystal semiconductor layer;

an interlayer insulating film which covers the single-crystal semiconductor layer, the gate insulating film, and the gate electrode;

a wiring which electrically connects one of the high-concentration impurity regions and the first pixel electrode to each other;

a partition which covers the interlayer insulating film and a part of the first pixel electrode, the partition having a second opening over a part of the first pixel electrode;

a light-emitting layer in the second opening; and a second pixel electrode which is electrically connected to the light-emitting layer over the light-emitting layer and the partition, wherein a difference between a height of a top surface of the first pixel electrode and a height of a bottom surface of the single-crystal semiconductor layer is 100 nm or less.

15. The semiconductor device according to claim 14, wherein the single-crystal semiconductor layer is a single-crystal silicon layer.

16. The semiconductor device according to claim 14, wherein the bonding layer comprises silicon oxide.

17. The semiconductor device according to claim 14, wherein the first pixel electrode comprises a light-transmitting conductive film.

18. The semiconductor device according to claim 14, wherein the first pixel electrode comprises a reflective conductive film.

19. The semiconductor device according to claim 14, wherein the top surface of the first pixel electrode is leveled.

20. The semiconductor device according to claim 14, wherein the top surface of the first pixel electrode and the bottom surface of the single-crystal semiconductor layer are coplanar.

* * * * *